US006798017B2

(12) United States Patent
Furukawa et al.

(10) Patent No.: US 6,798,017 B2
(45) Date of Patent: Sep. 28, 2004

(54) VERTICAL DUAL GATE FIELD EFFECT TRANSISTOR

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); James M. Leas, South Burlington, VT (US); William H-L Ma, Fishkill, NY (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/944,665

(22) Filed: Aug. 31, 2001

(65) Prior Publication Data

US 2003/0052364 A1 Mar. 20, 2003

(51) Int. Cl.[7] .......................... H01L 29/76; H01L 29/94; H01L 31/062
(52) U.S. Cl. .......................... 257/329; 257/330; 257/331
(58) Field of Search .................. 257/328, 329, 257/330, 331

(56) References Cited

U.S. PATENT DOCUMENTS

| 4,851,889 | A |   | 7/1989 | Matsuzaki |
| 5,293,053 | A | * | 3/1994 | Malhi et al. ................. 257/330 |
| 5,374,571 | A |   | 12/1994 | Mukherjee et al. |
| 5,656,842 | A |   | 8/1997 | Iwamatsu et al. |
| 5,668,391 | A |   | 9/1997 | Kim et al. |
| 5,723,233 | A |   | 3/1998 | Garza et al. |
| 5,766,806 | A |   | 6/1998 | Spence |
| 5,766,829 | A |   | 6/1998 | Cathey, Jr. et al. |
| 5,831,329 | A |   | 11/1998 | Marso et al. |
| 5,886,382 | A |   | 3/1999 | Witek |
| 5,937,283 | A |   | 8/1999 | Lee |
| 5,963,800 | A |   | 10/1999 | Augusto |
| 6,392,271 | B1 | * | 5/2002 | Alavi et al. ................. 257/331 |

FOREIGN PATENT DOCUMENTS

JP            3-225873      * 10/1991    ................. 257/331

OTHER PUBLICATIONS

J.M. Hergenrother et al.; "The Vertical Replacement–Gate (VRG) MOSFET: A 50–nm Vertical MOSFET with Lithography–Independent Gate Length"; Bell Labs., Lucent Technologies.

"Revolutionary Transistor Design Turns the Silicon World on End"; www.bell-labs.com/news/1999/november.

* cited by examiner

*Primary Examiner*—Steven Loke
(74) *Attorney, Agent, or Firm*—Whitham, Curtis & Christofferson, P.C.; William D. Sabo

(57) ABSTRACT

A vertical transistor particularly suitable for high density integration includes potentially independent gate structures on opposite sides of a semiconductor pillar formed by etching or epitaxial growth in a trench. The gate structure is surrounded by insulating material which is selectively etchable to isolation material surrounding the transistor. A contact is made to the lower end of the pillar (e.g. the transistor drain) by selectively etching the isolation material selective to the insulating material. The upper end of the pillar is covered by a cap and sidewalls of selectively etchable materials so that gate and source connection openings can also be made by selective etching with good registration tolerance. A dimension of the pillar in a direction parallel to the chip surface is defined by a distance between isolation regions and selective etching and height of the pillar is defined by thickness of a sacrificial layer.

37 Claims, 39 Drawing Sheets

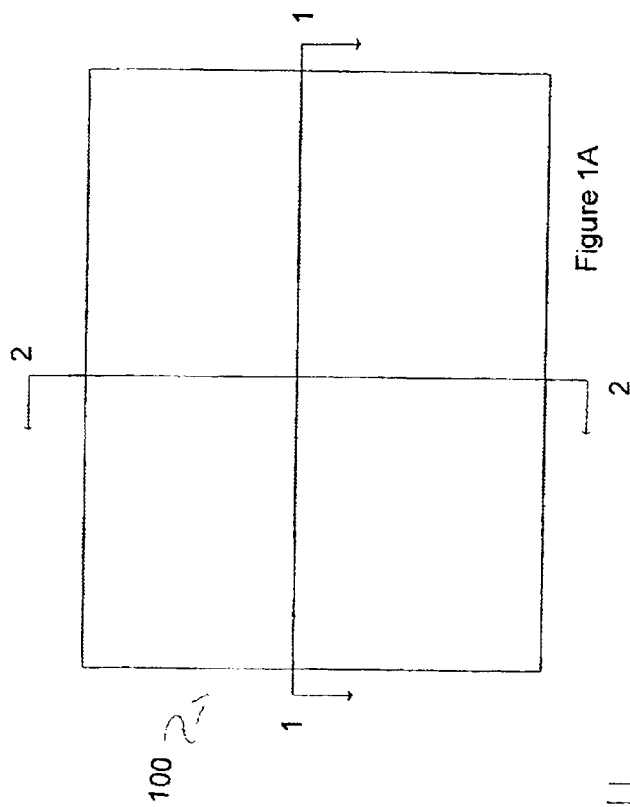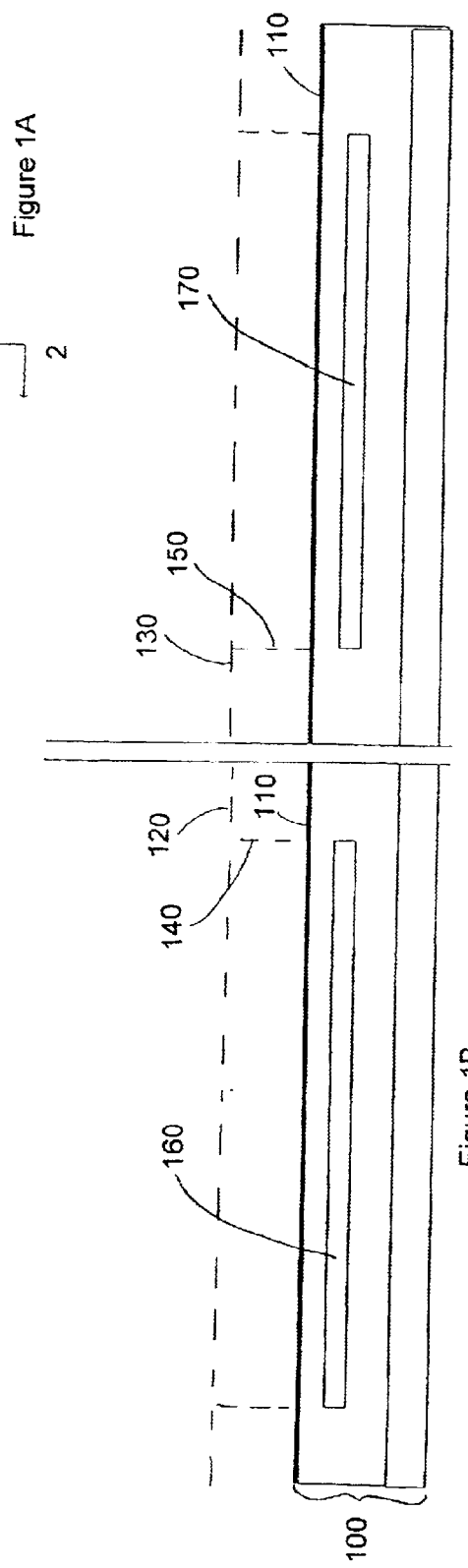

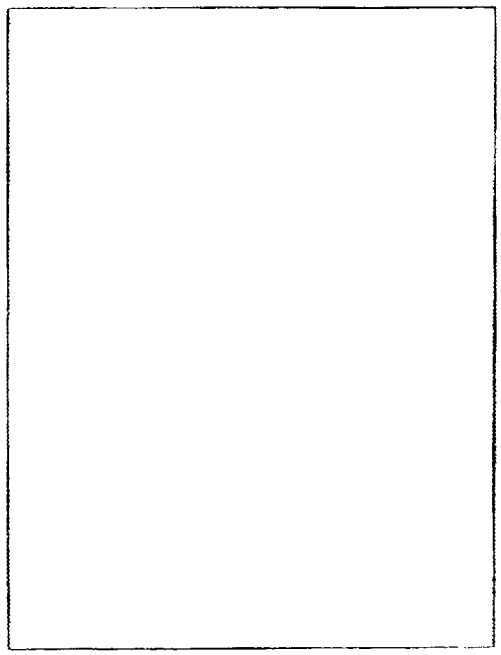
Figure 2A
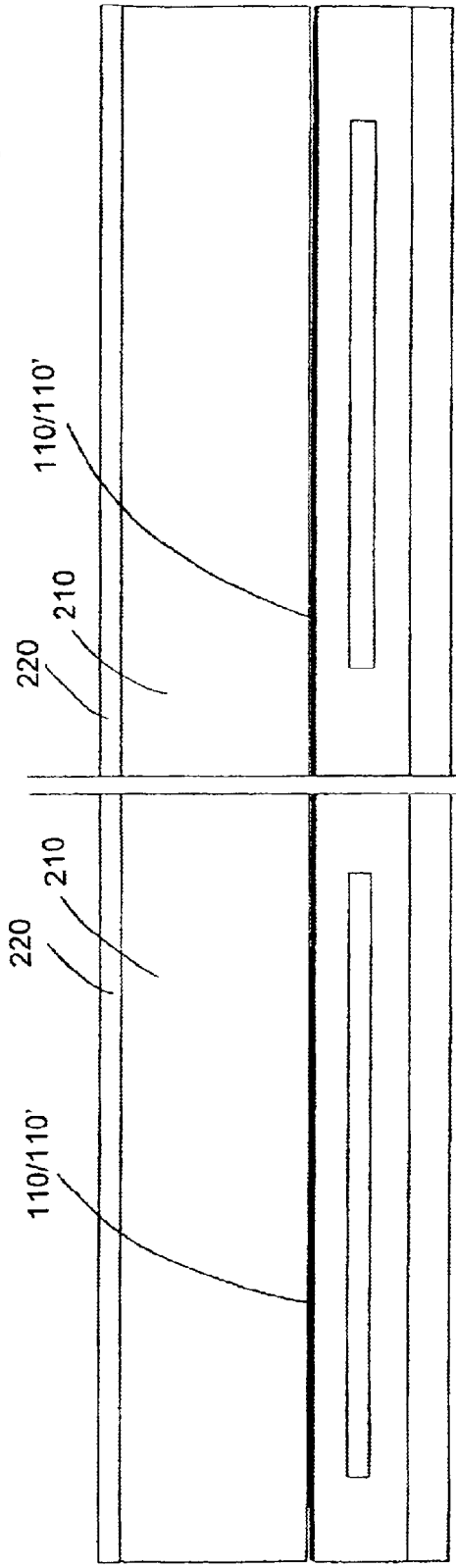
Figure 2B
Figure 2C

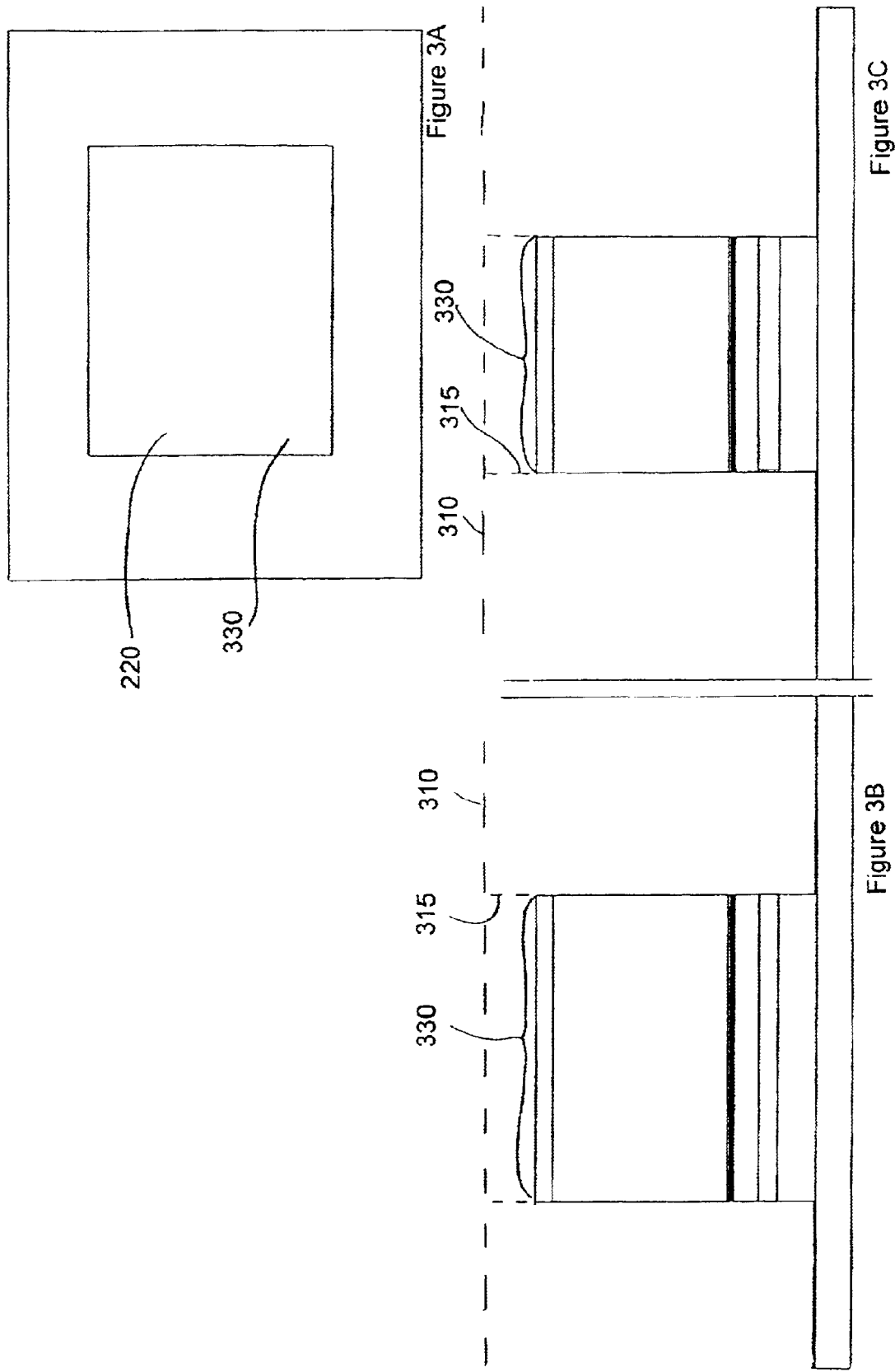

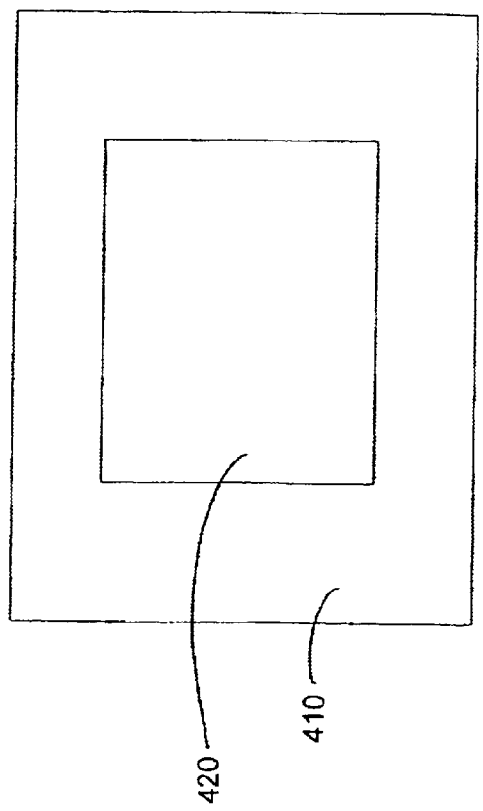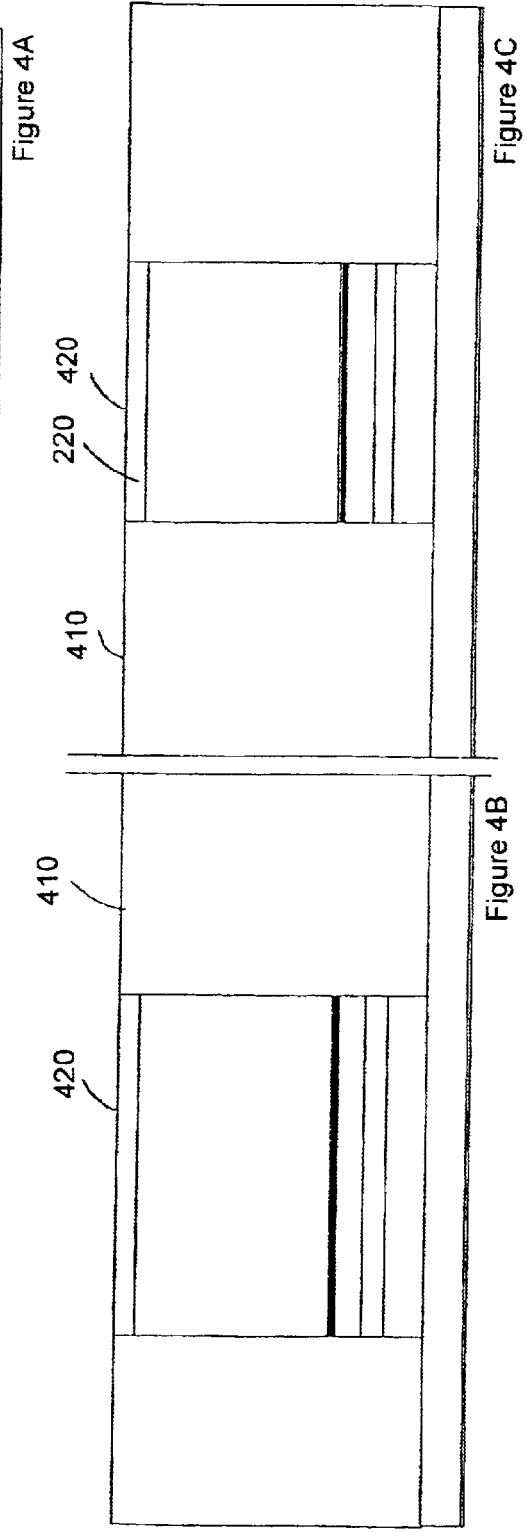

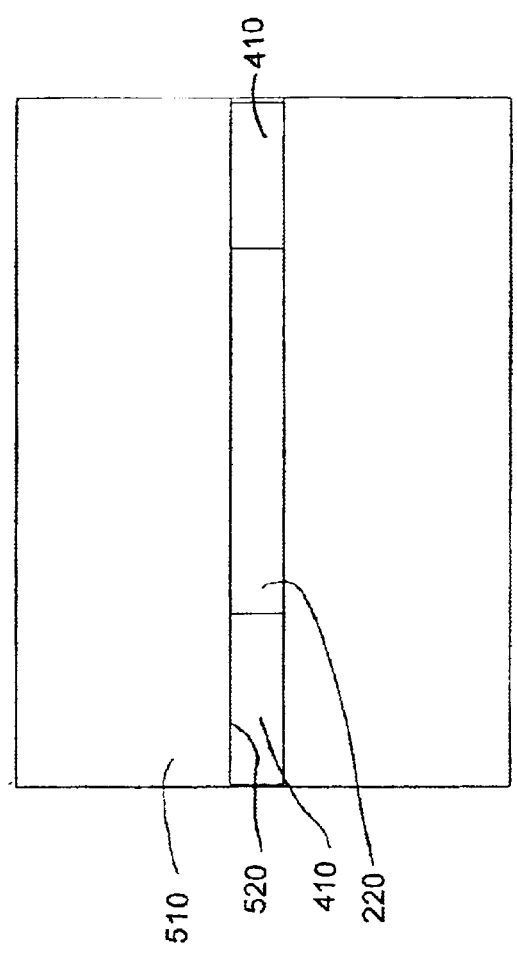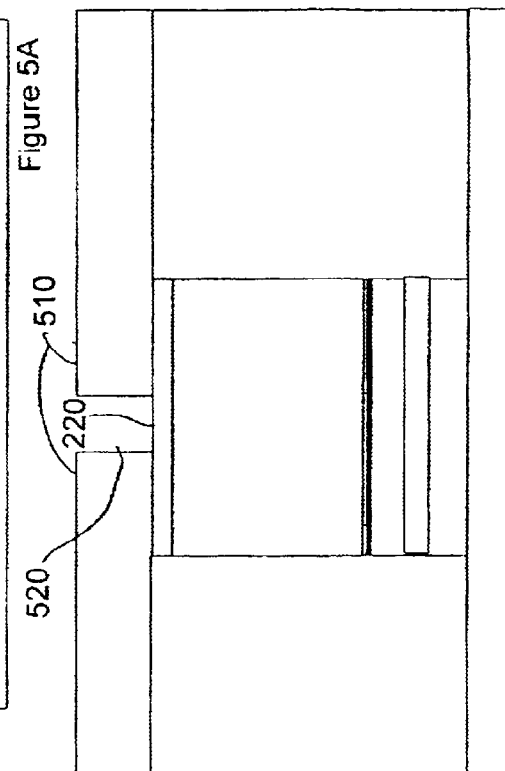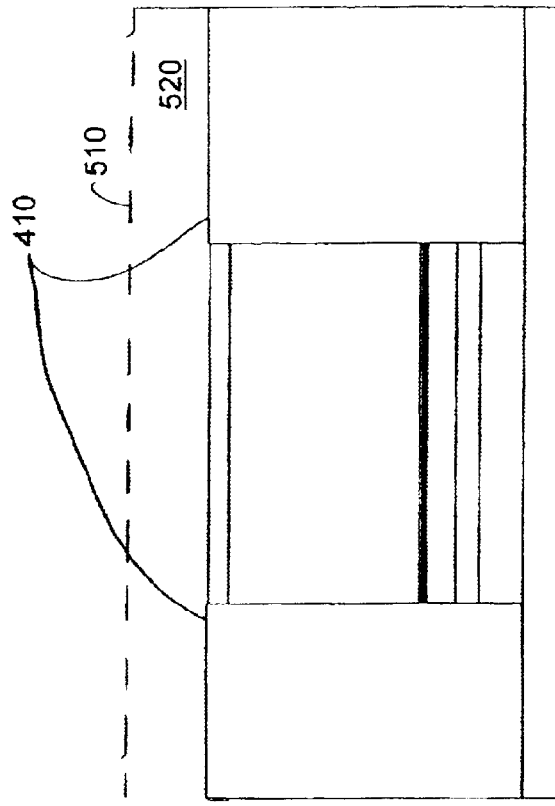

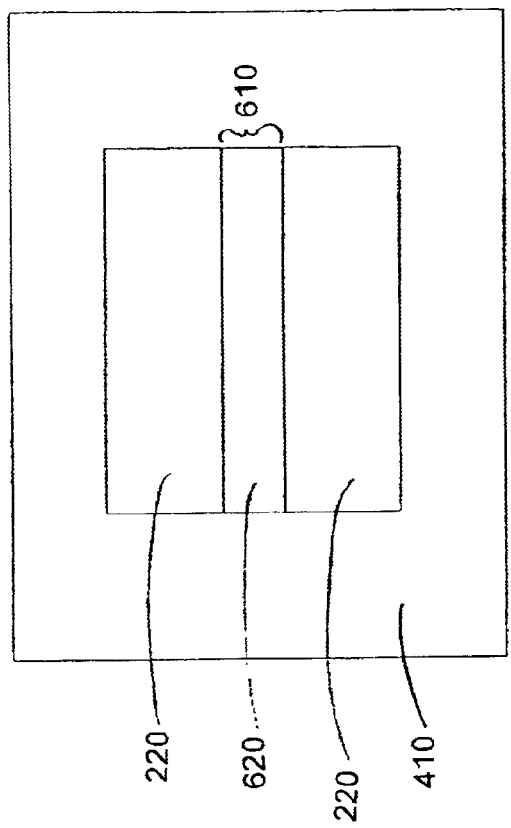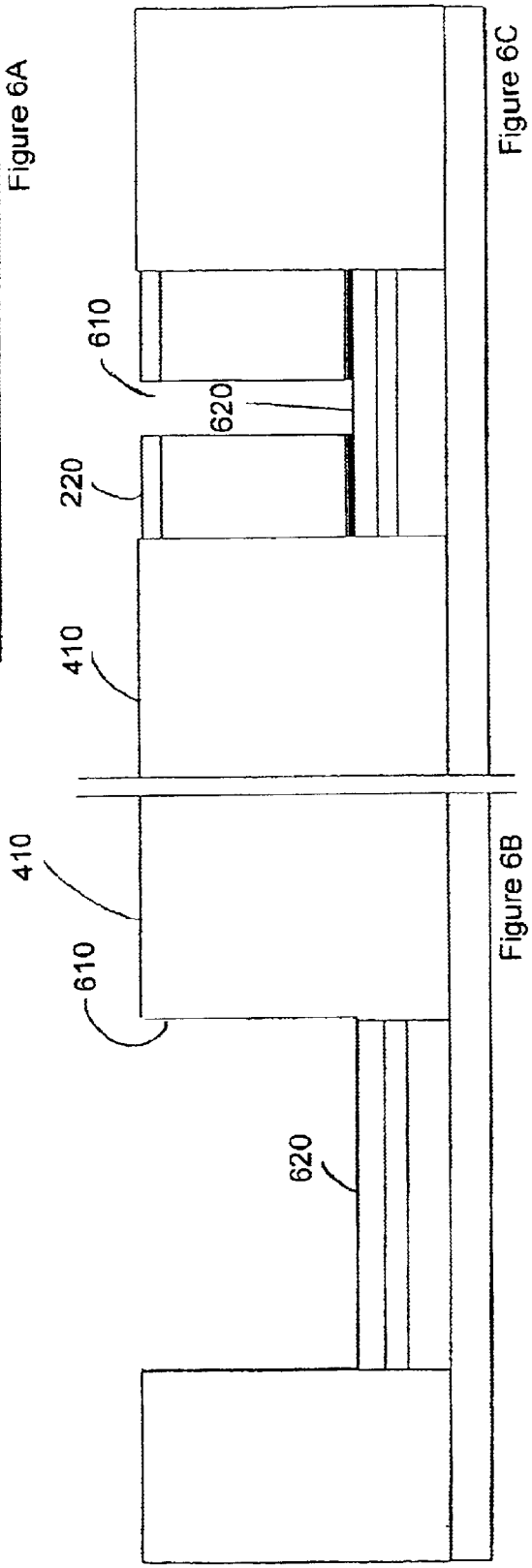

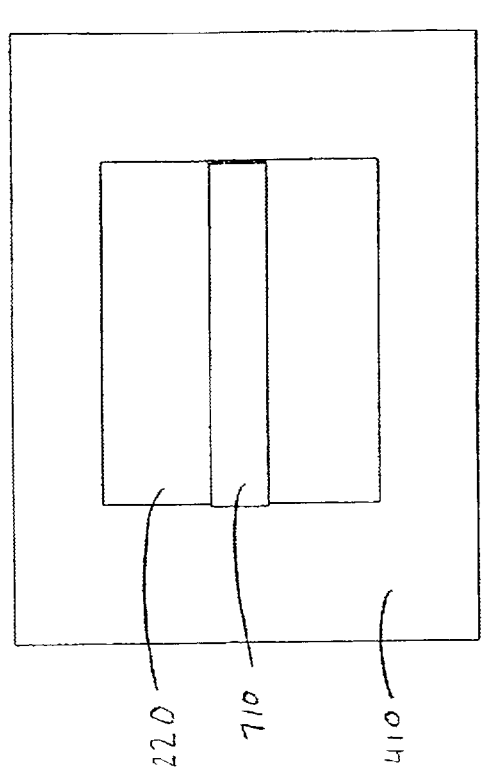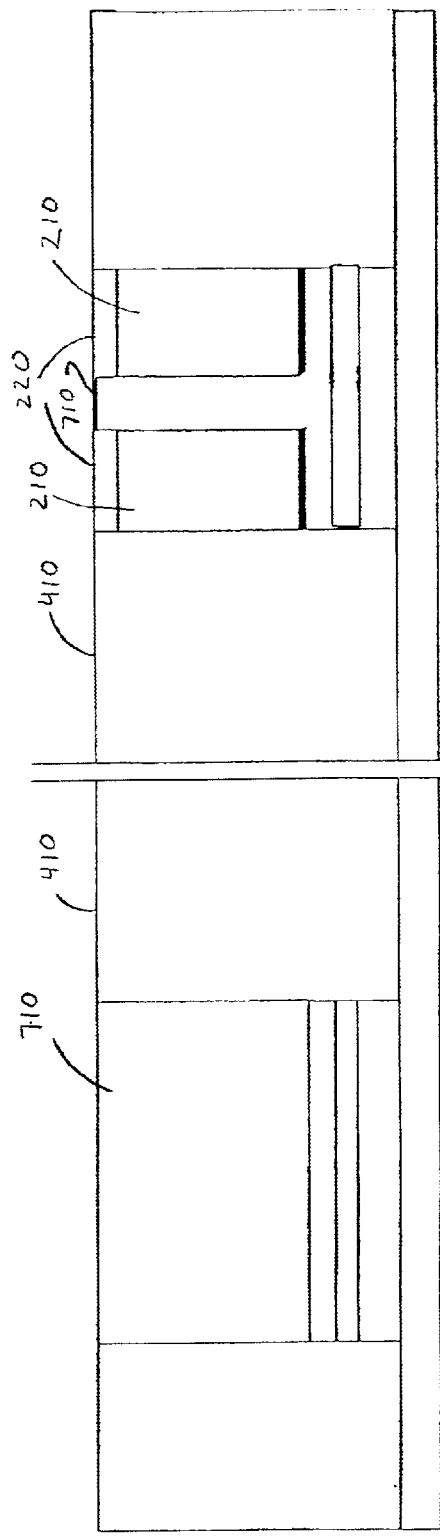

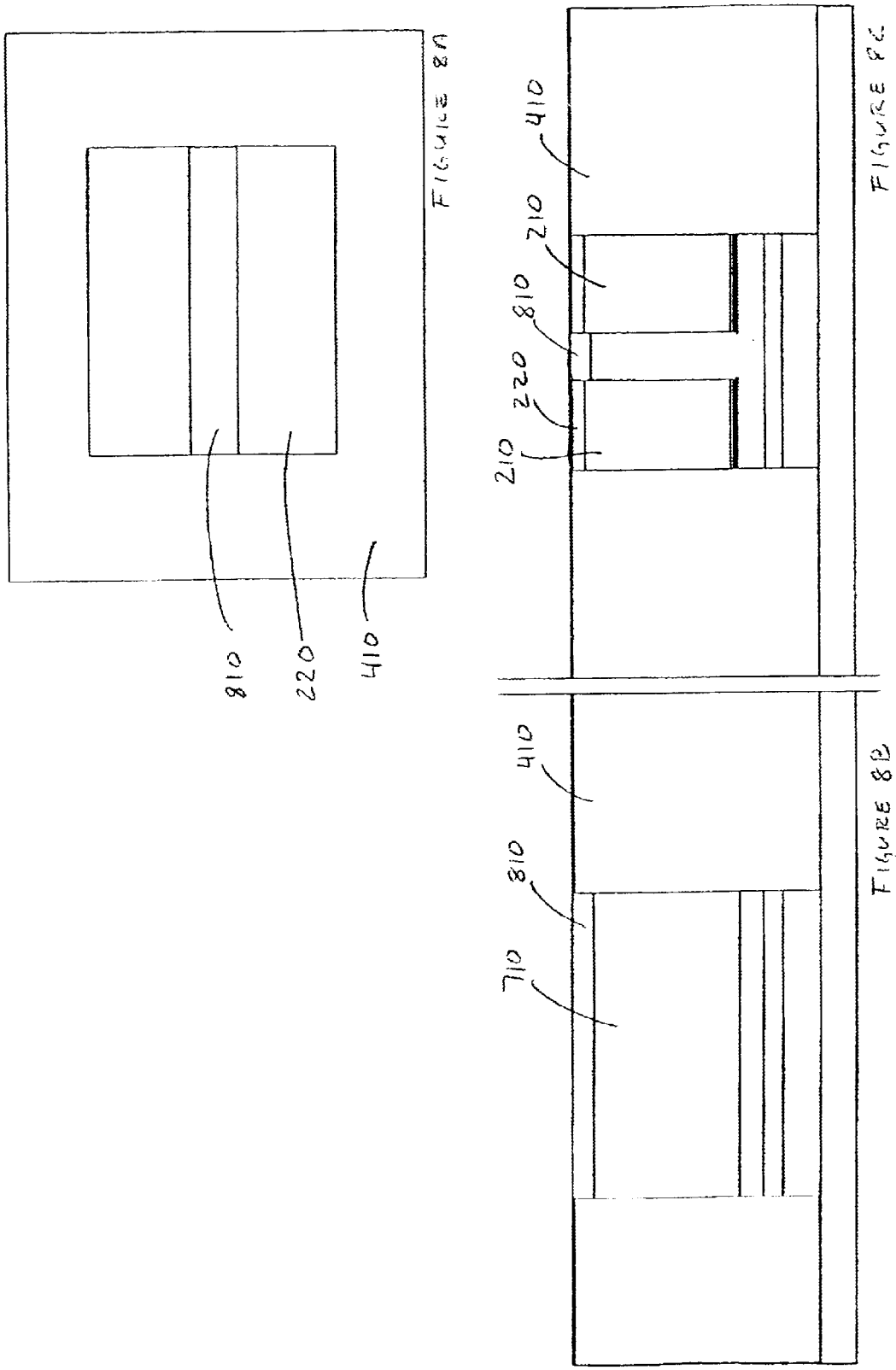

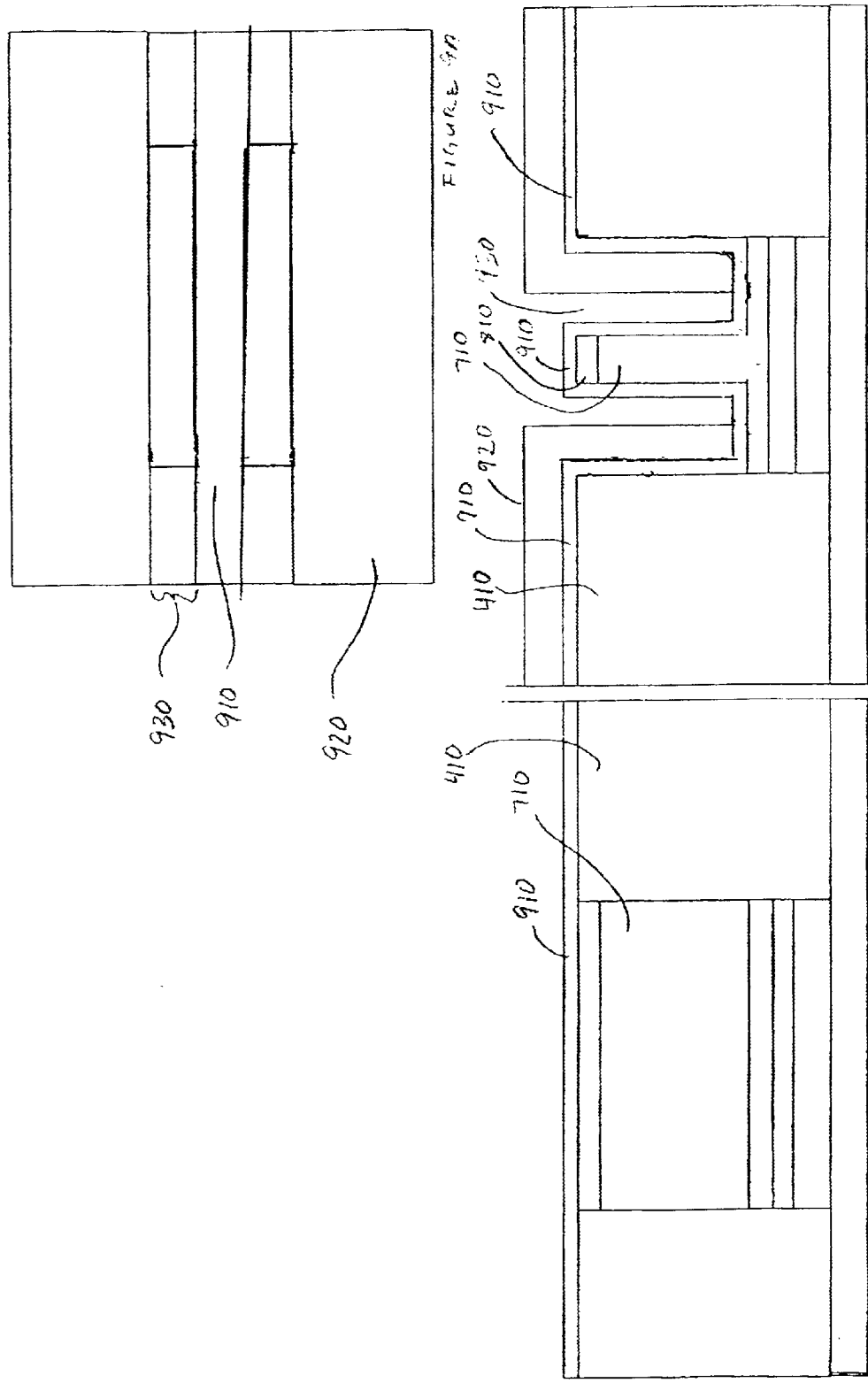

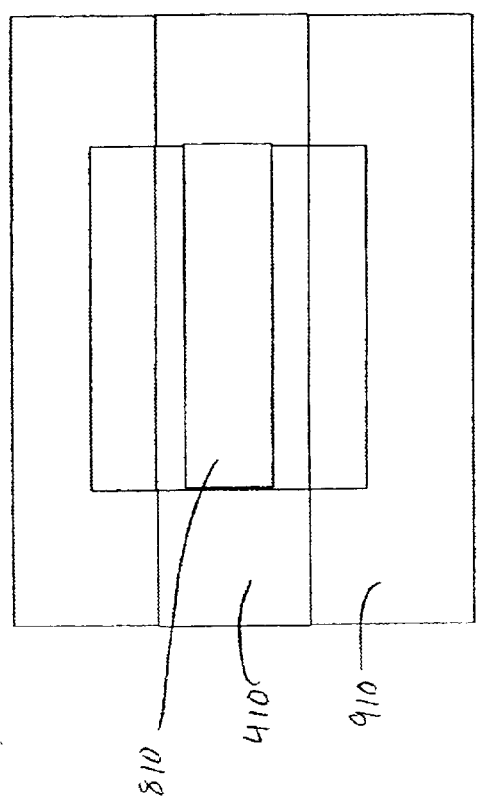
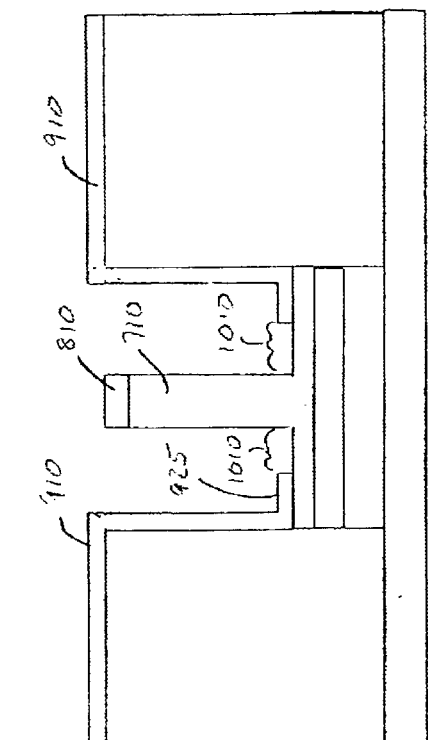
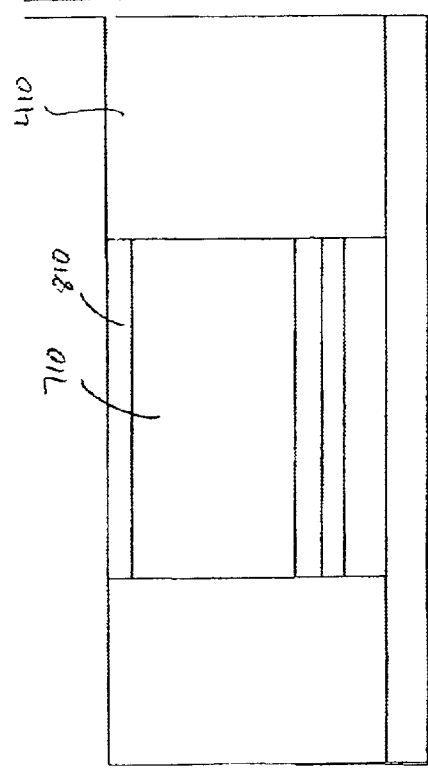

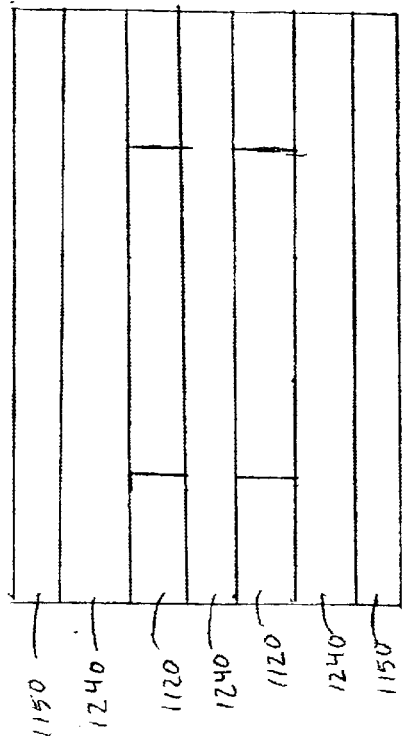
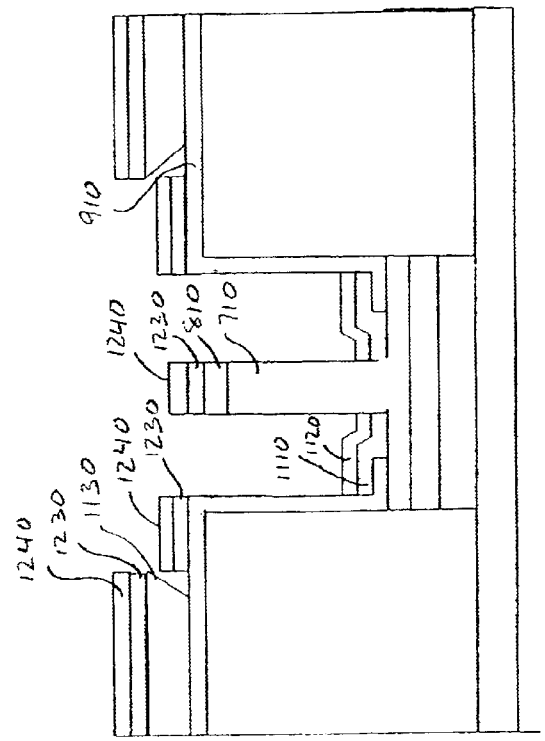
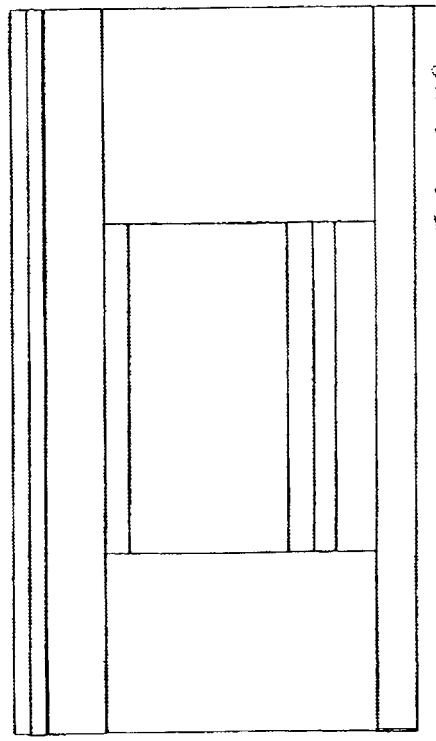

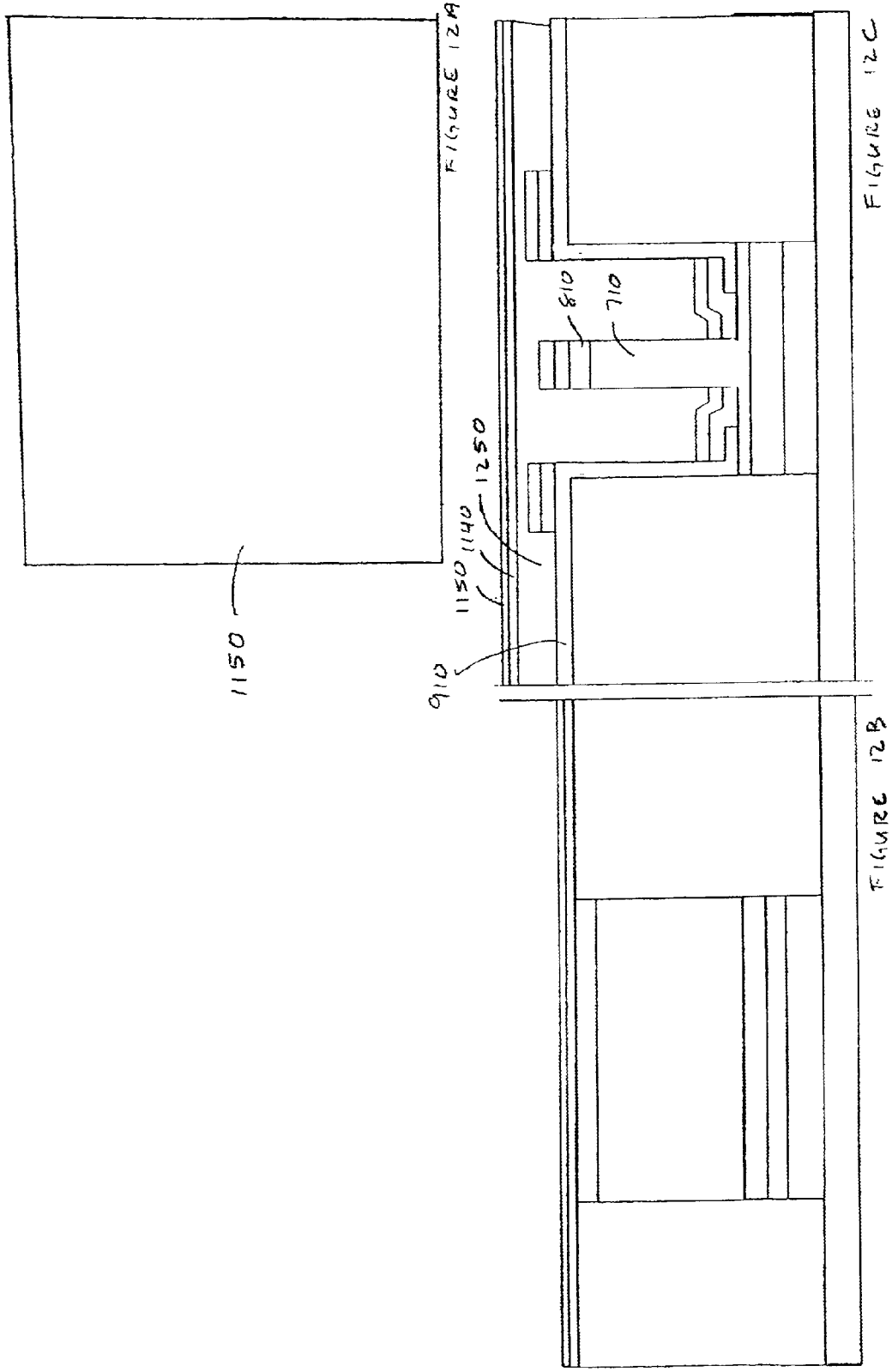

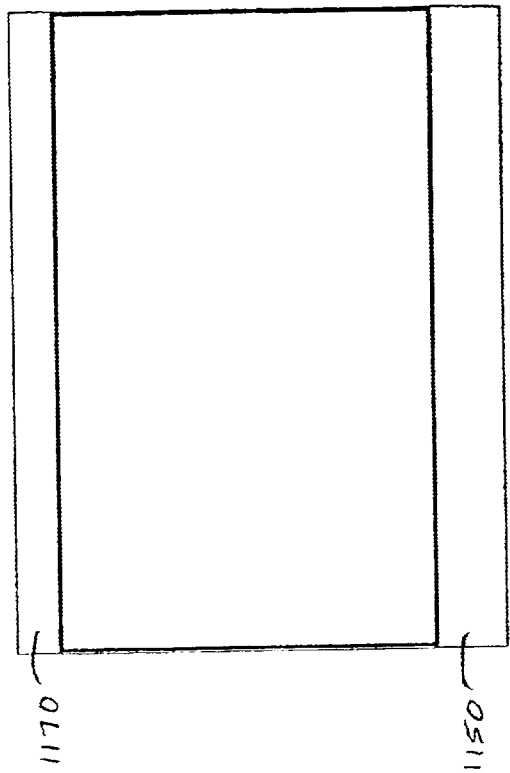
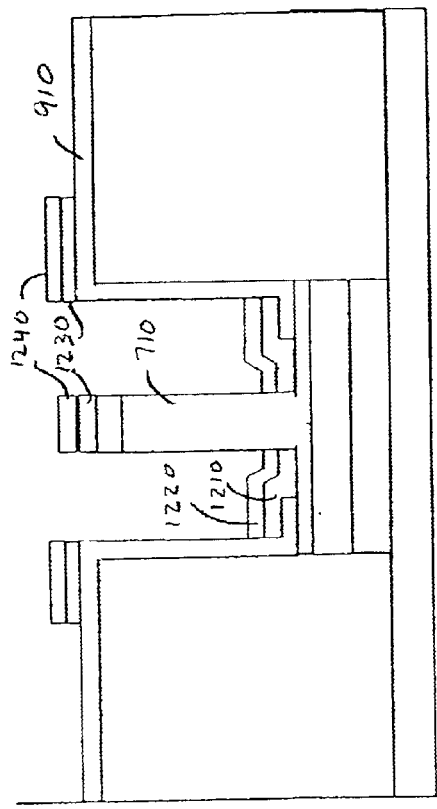
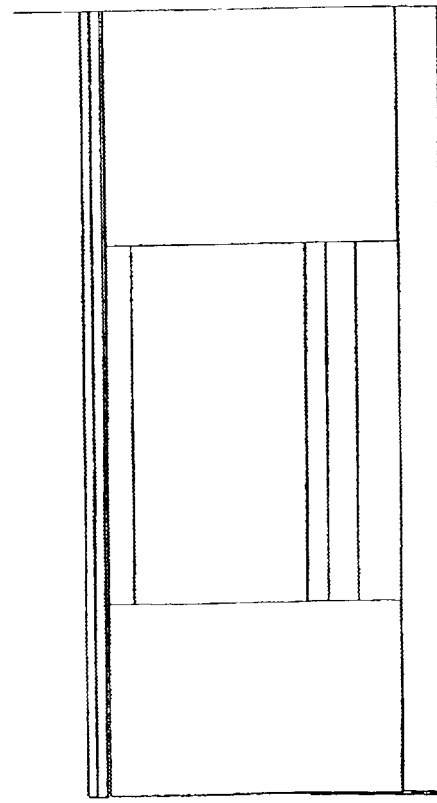

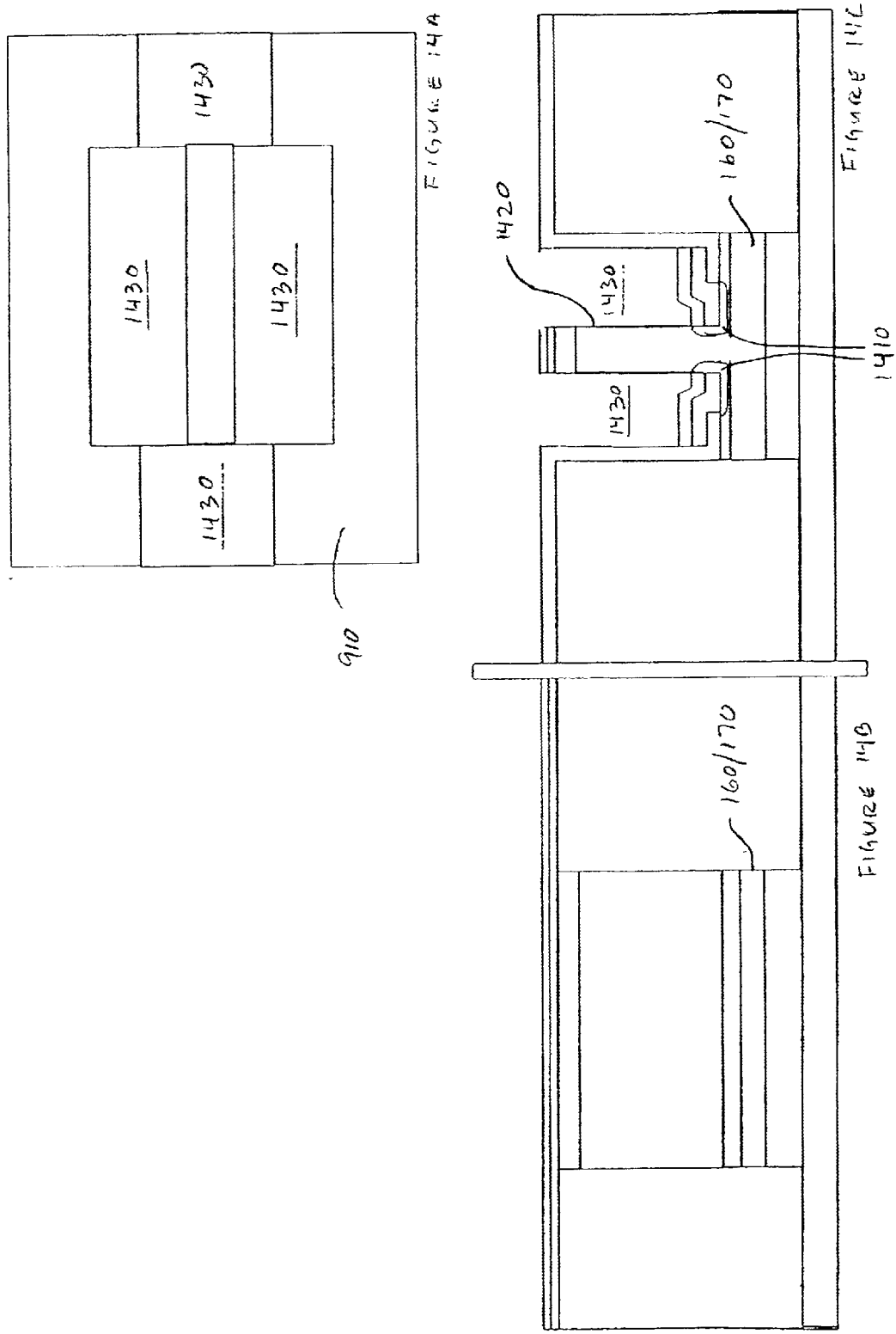

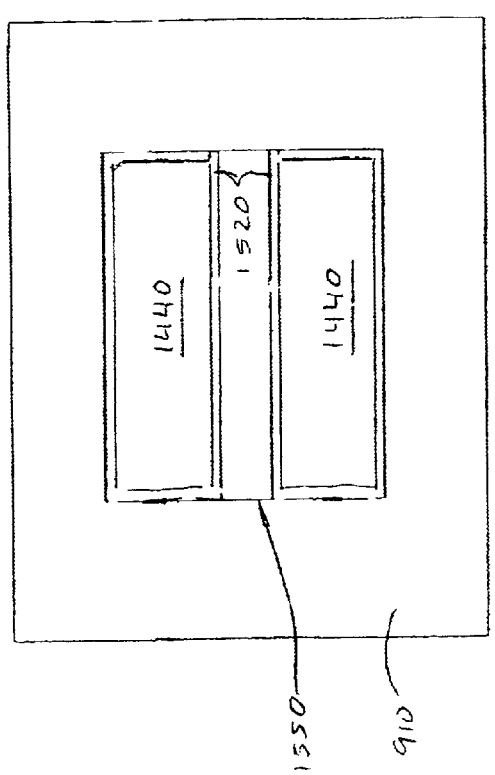
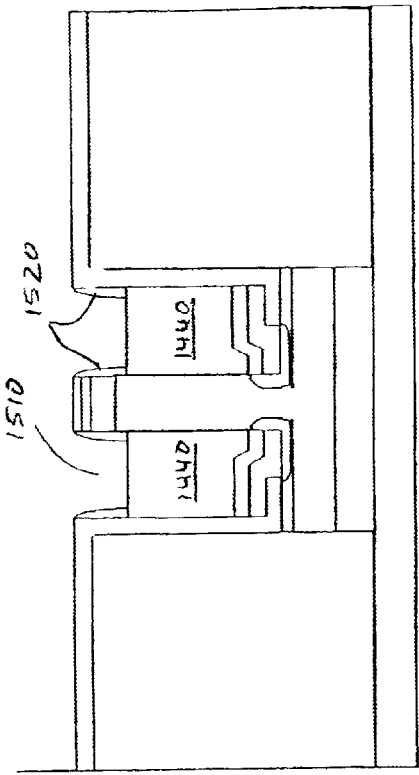
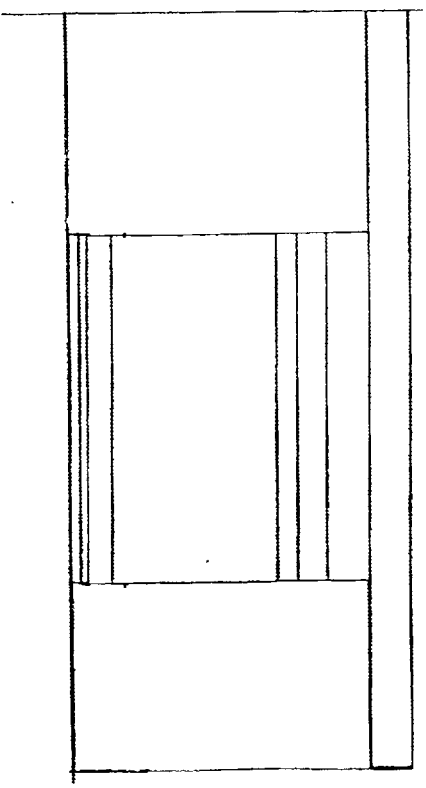

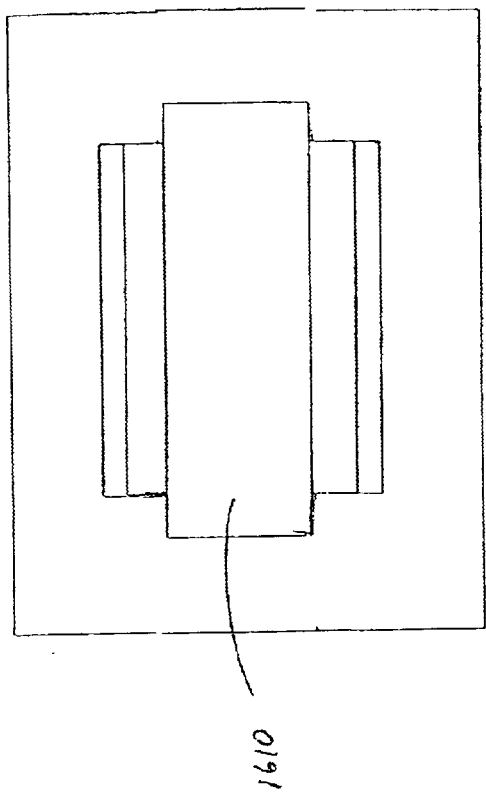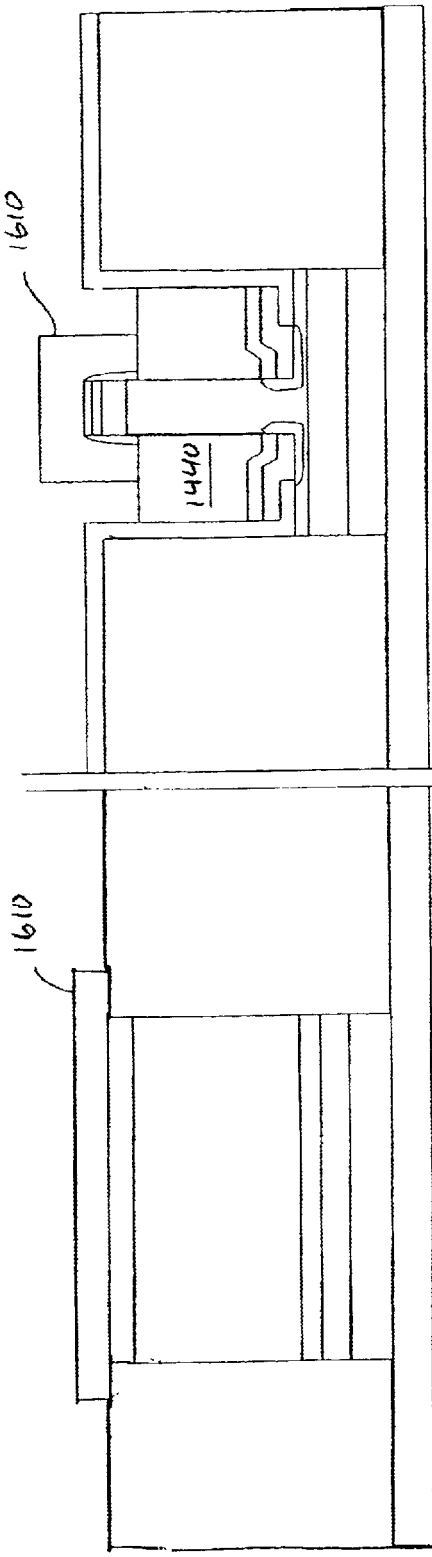

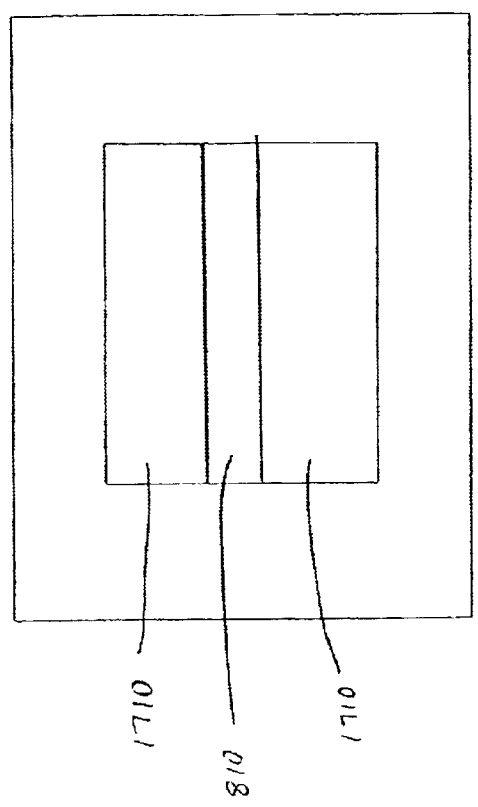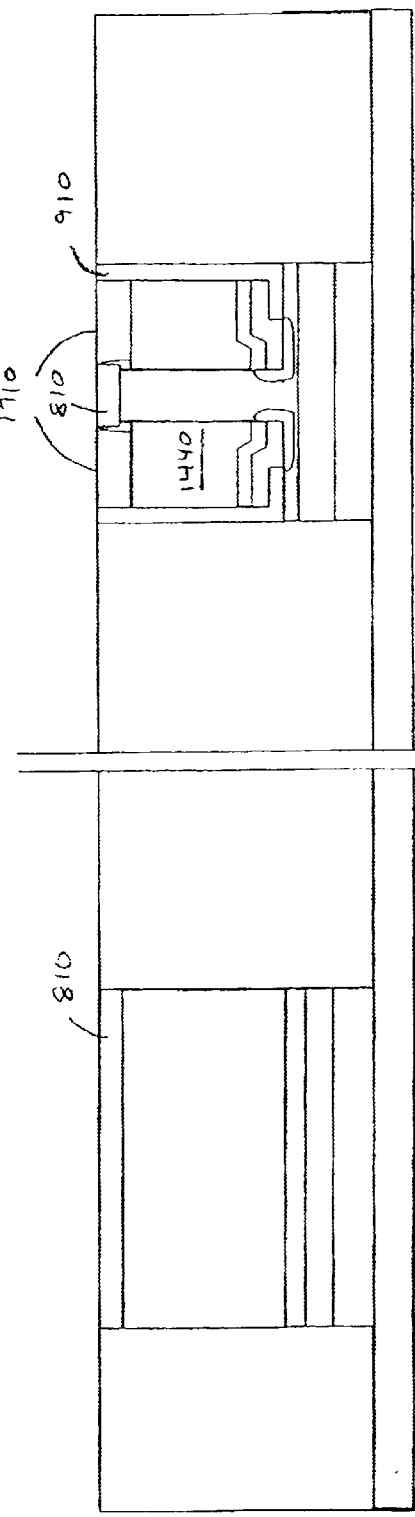

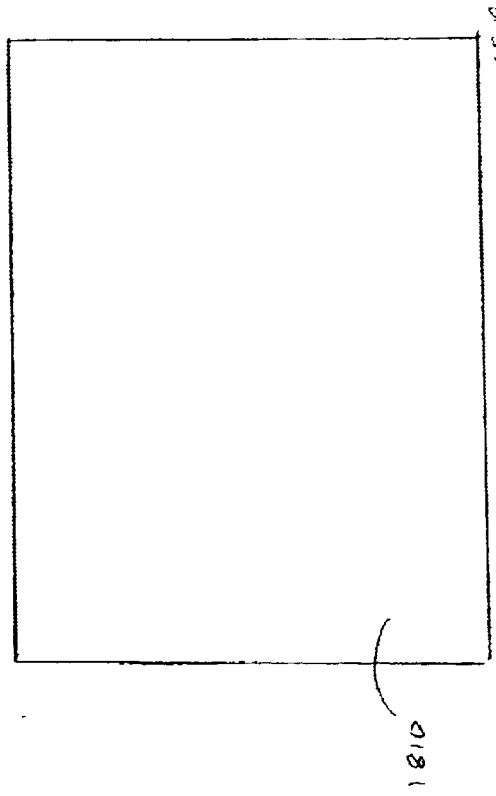
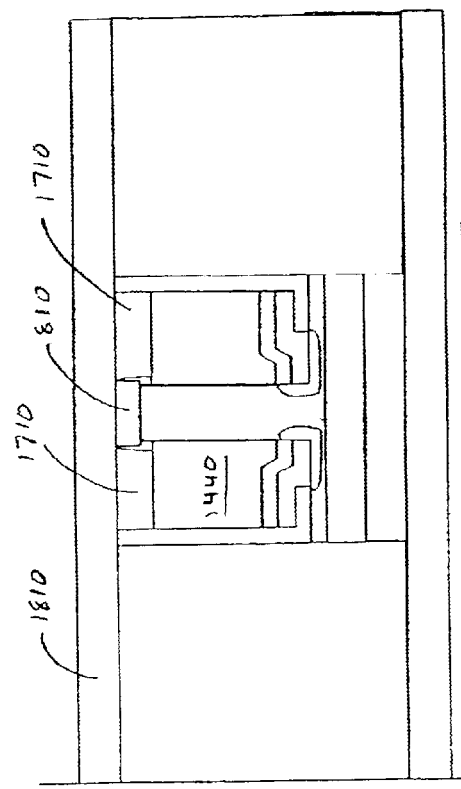
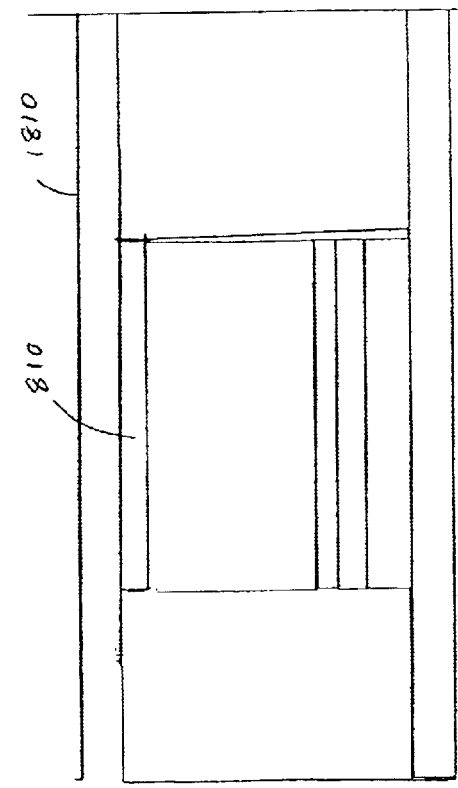

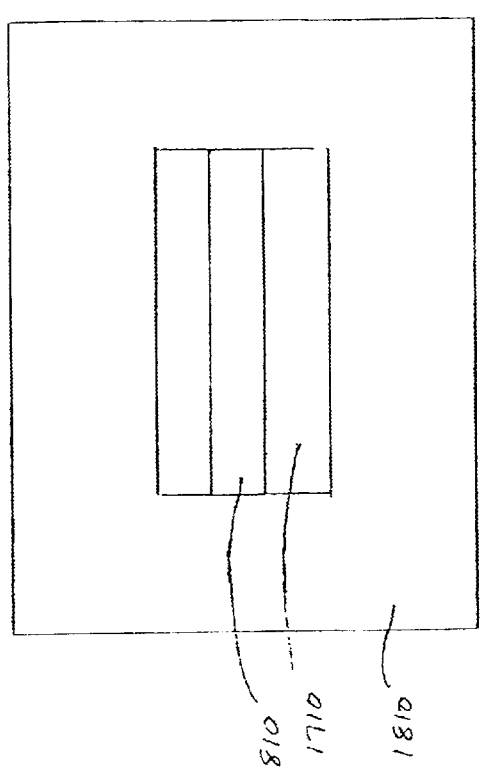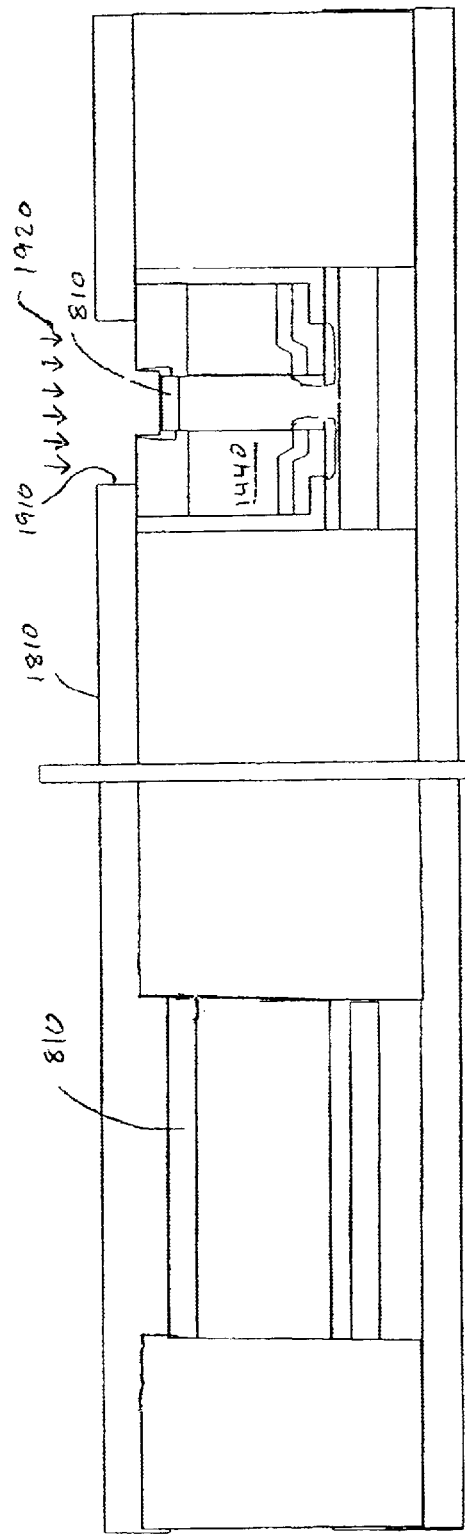

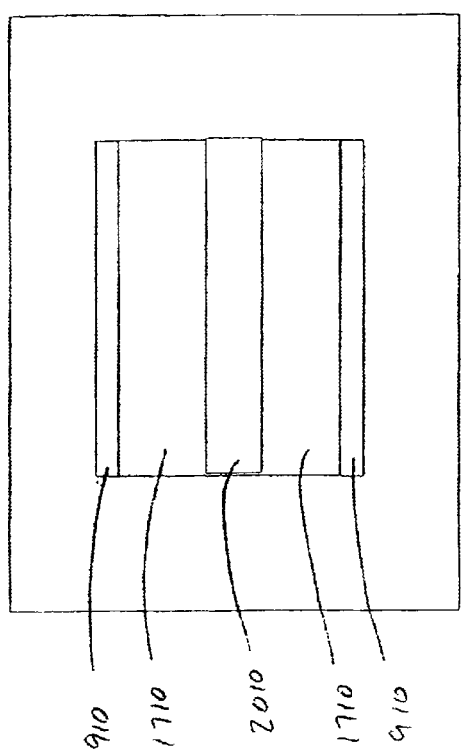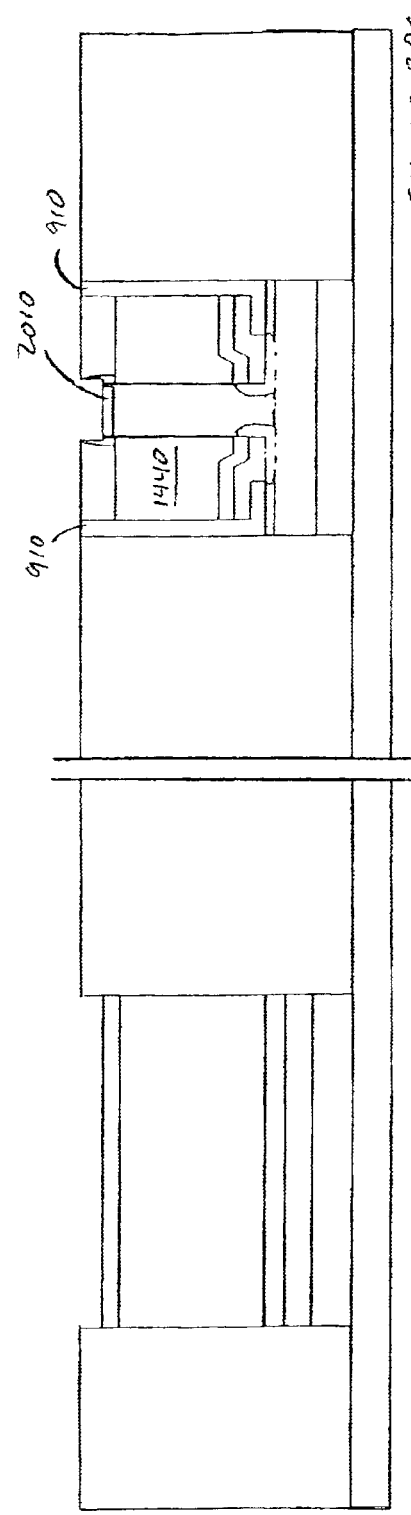

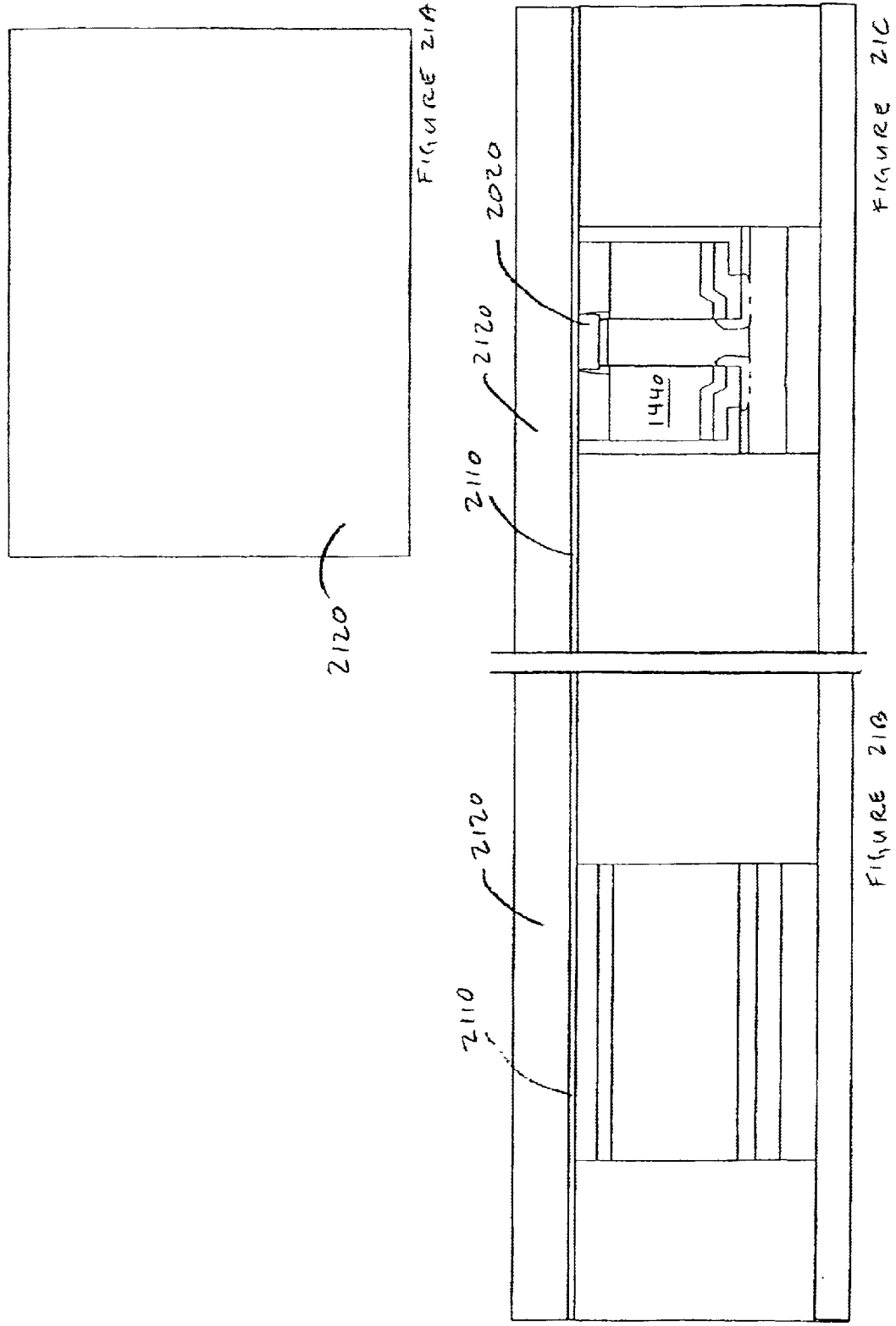

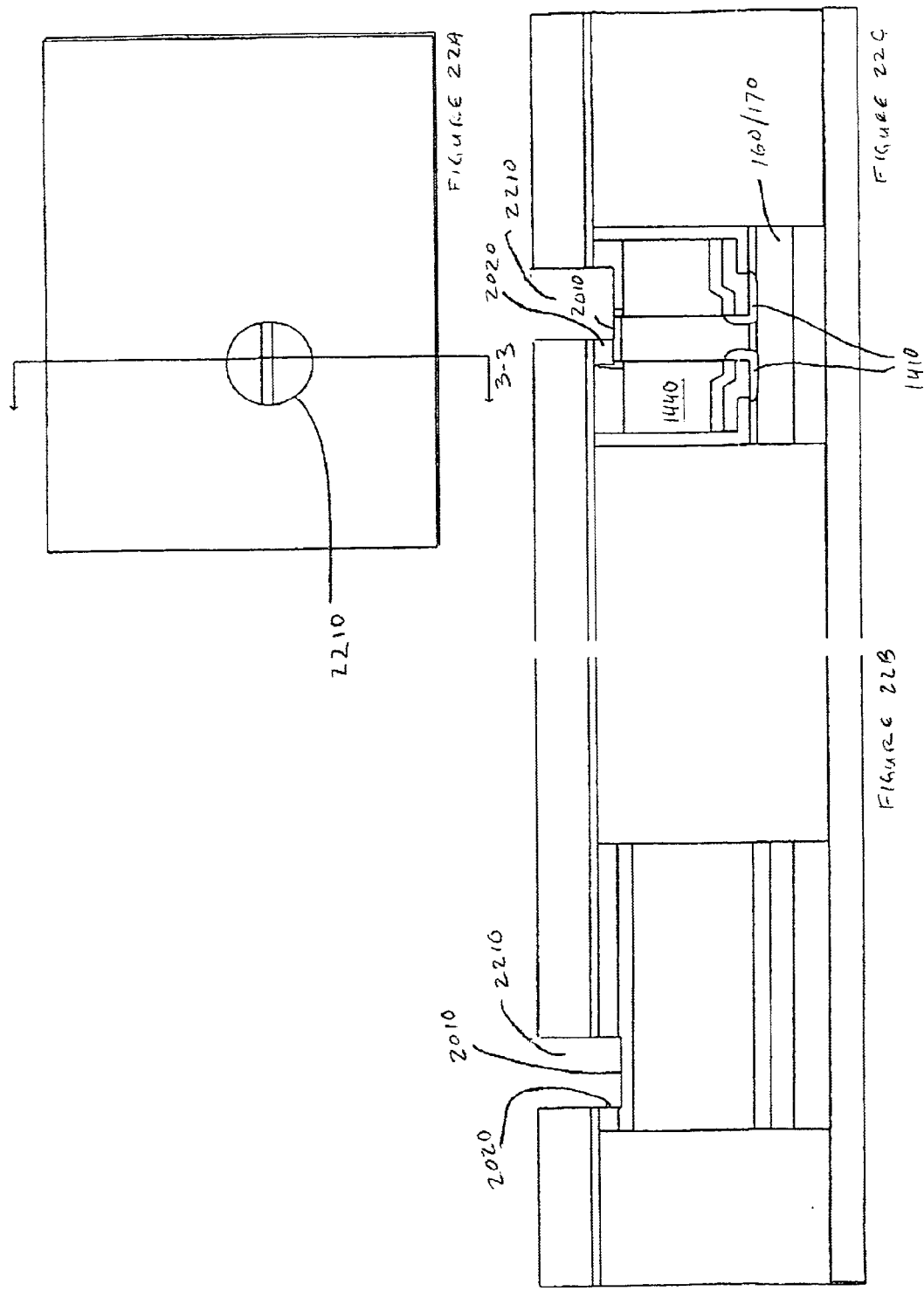

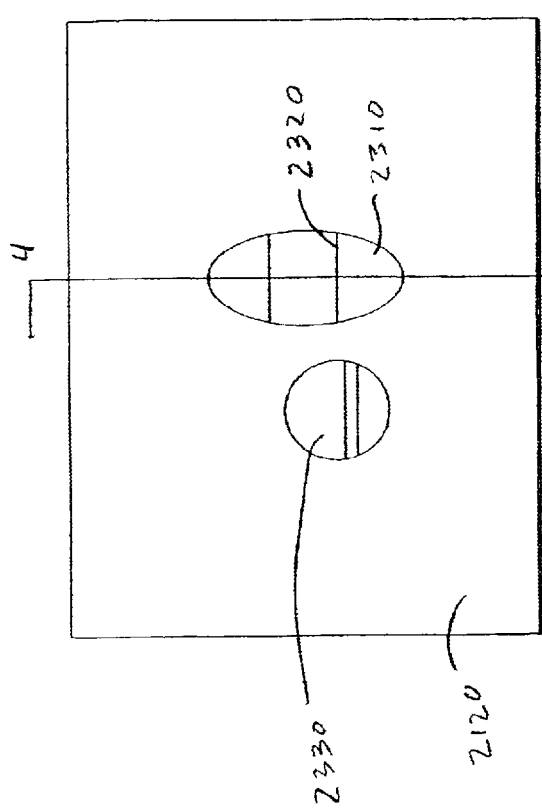
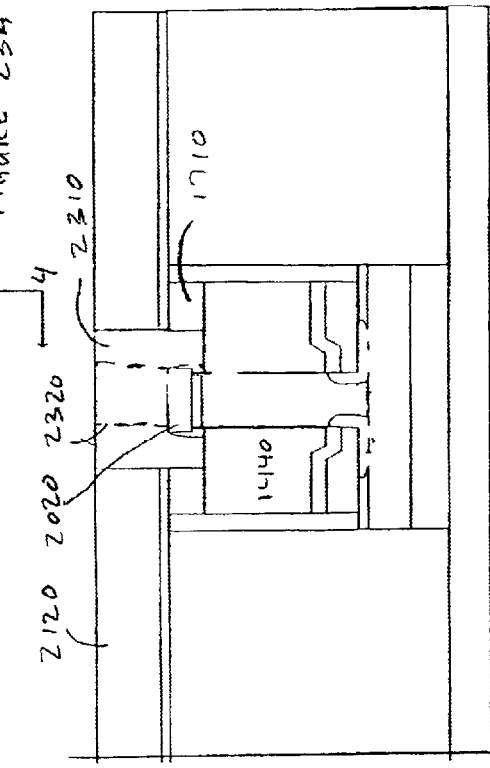
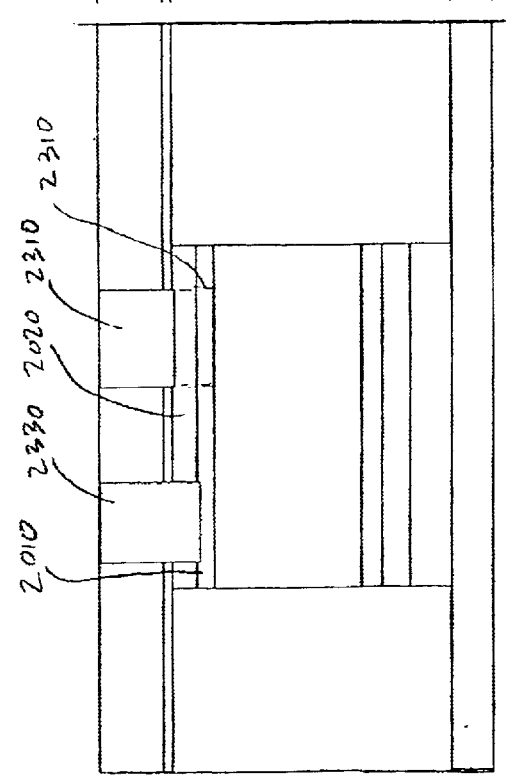

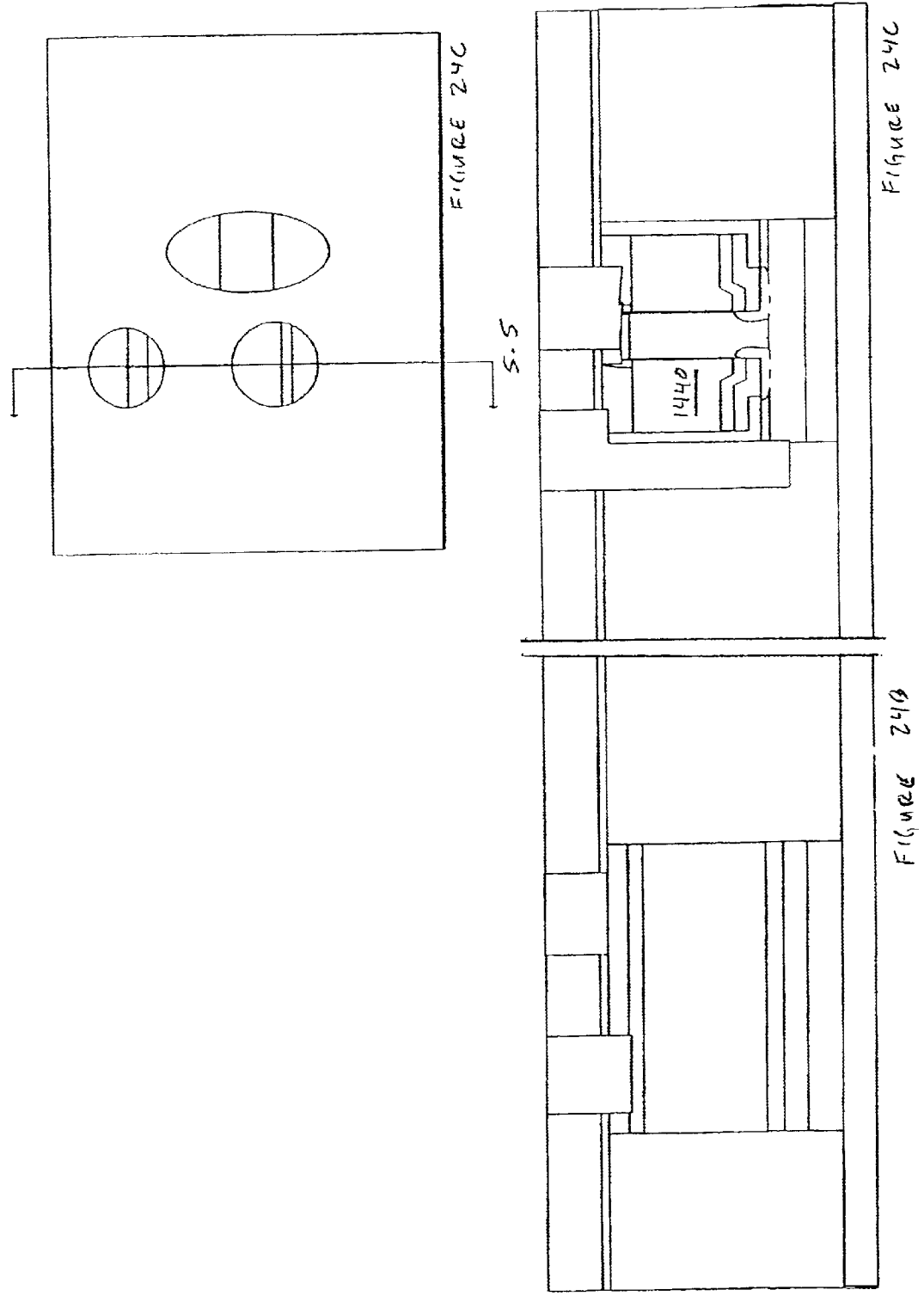

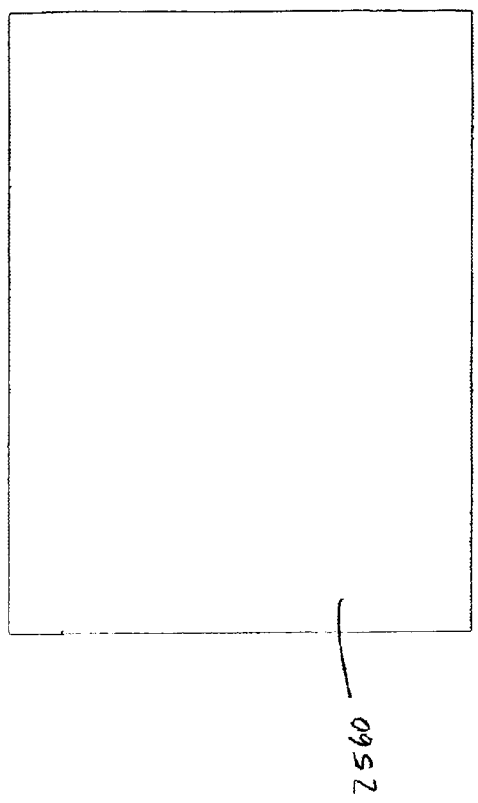
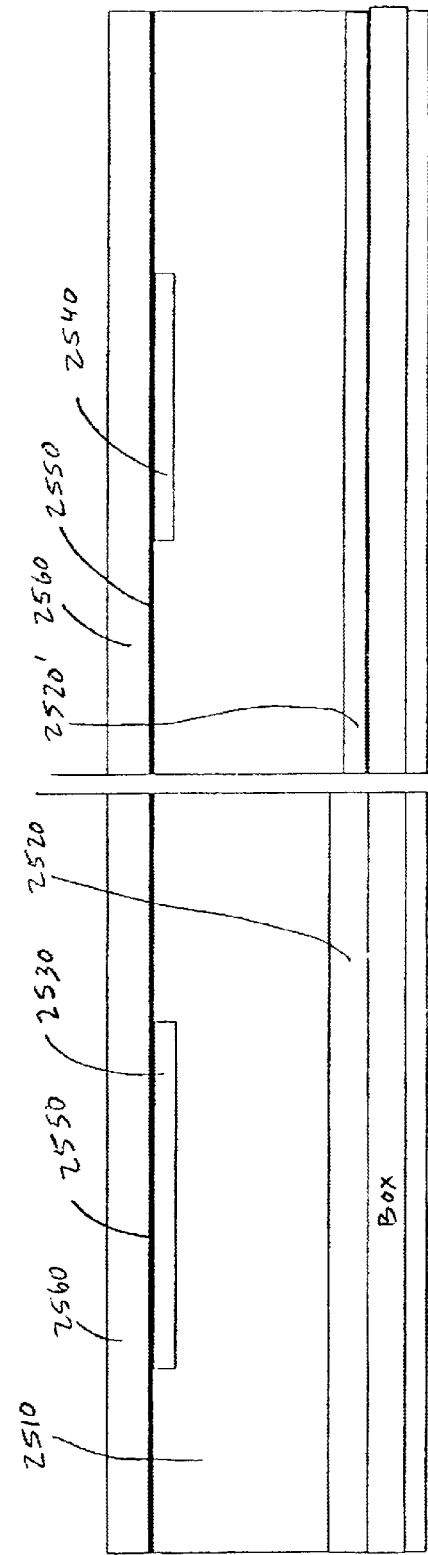

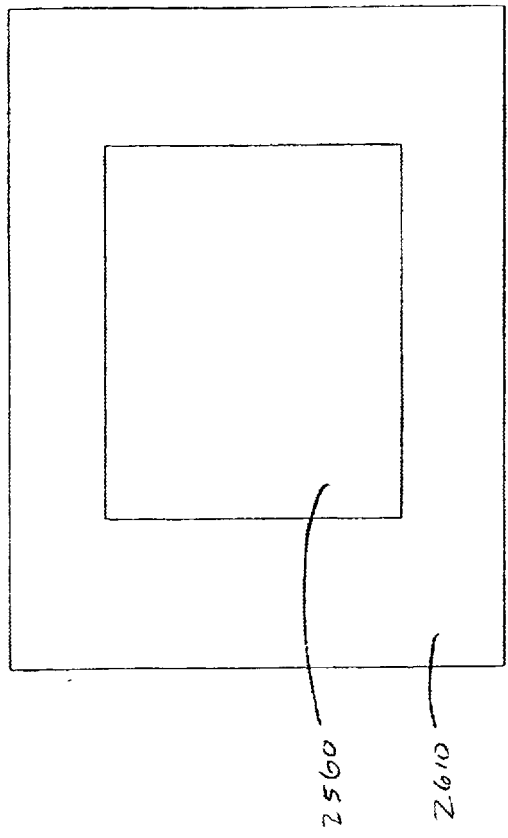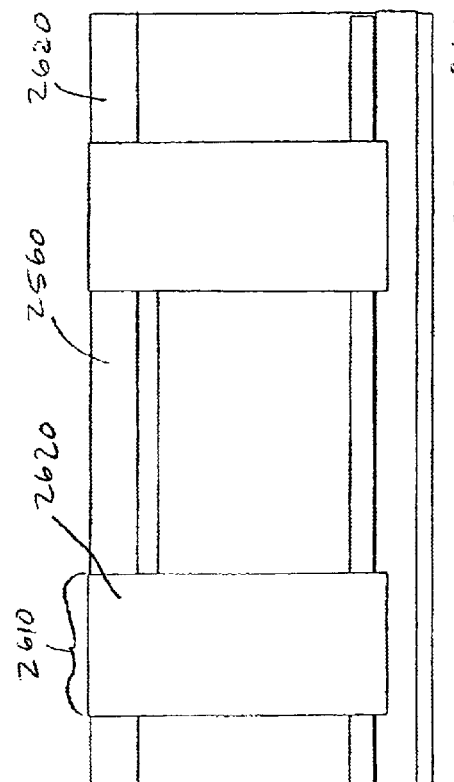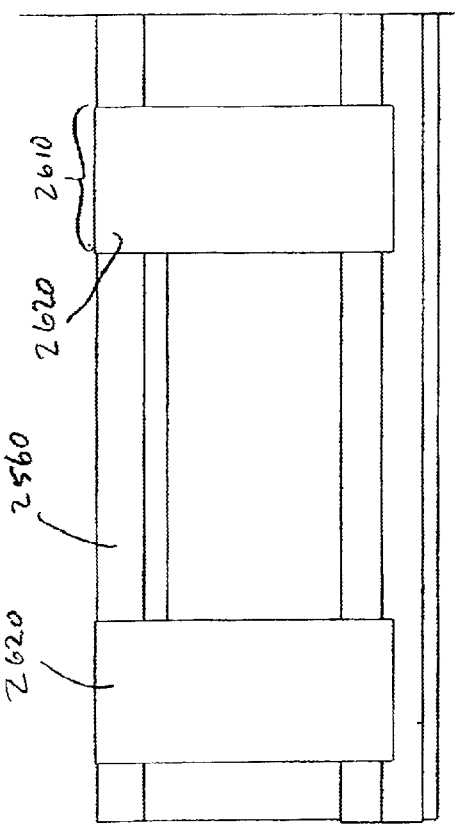

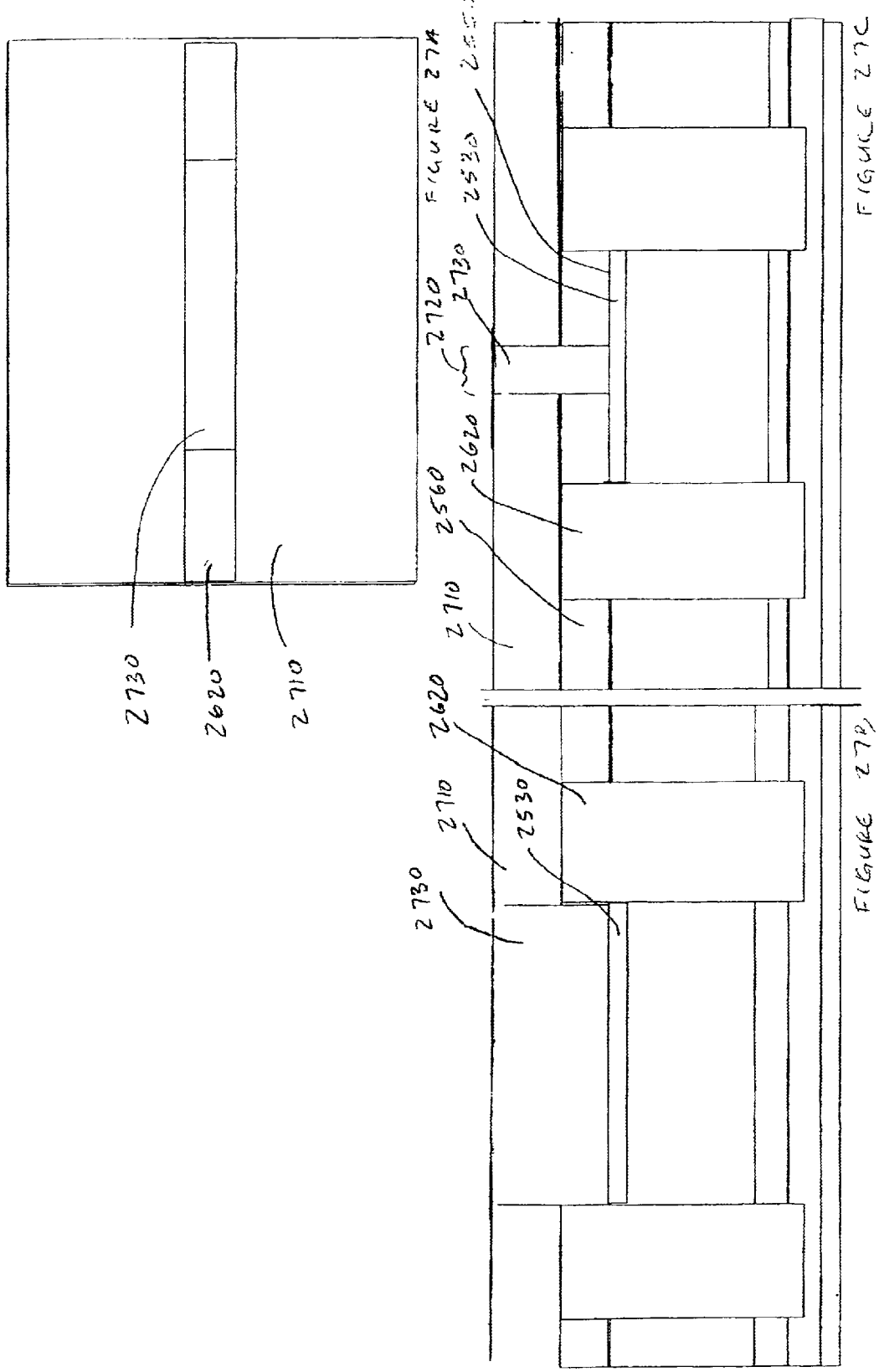

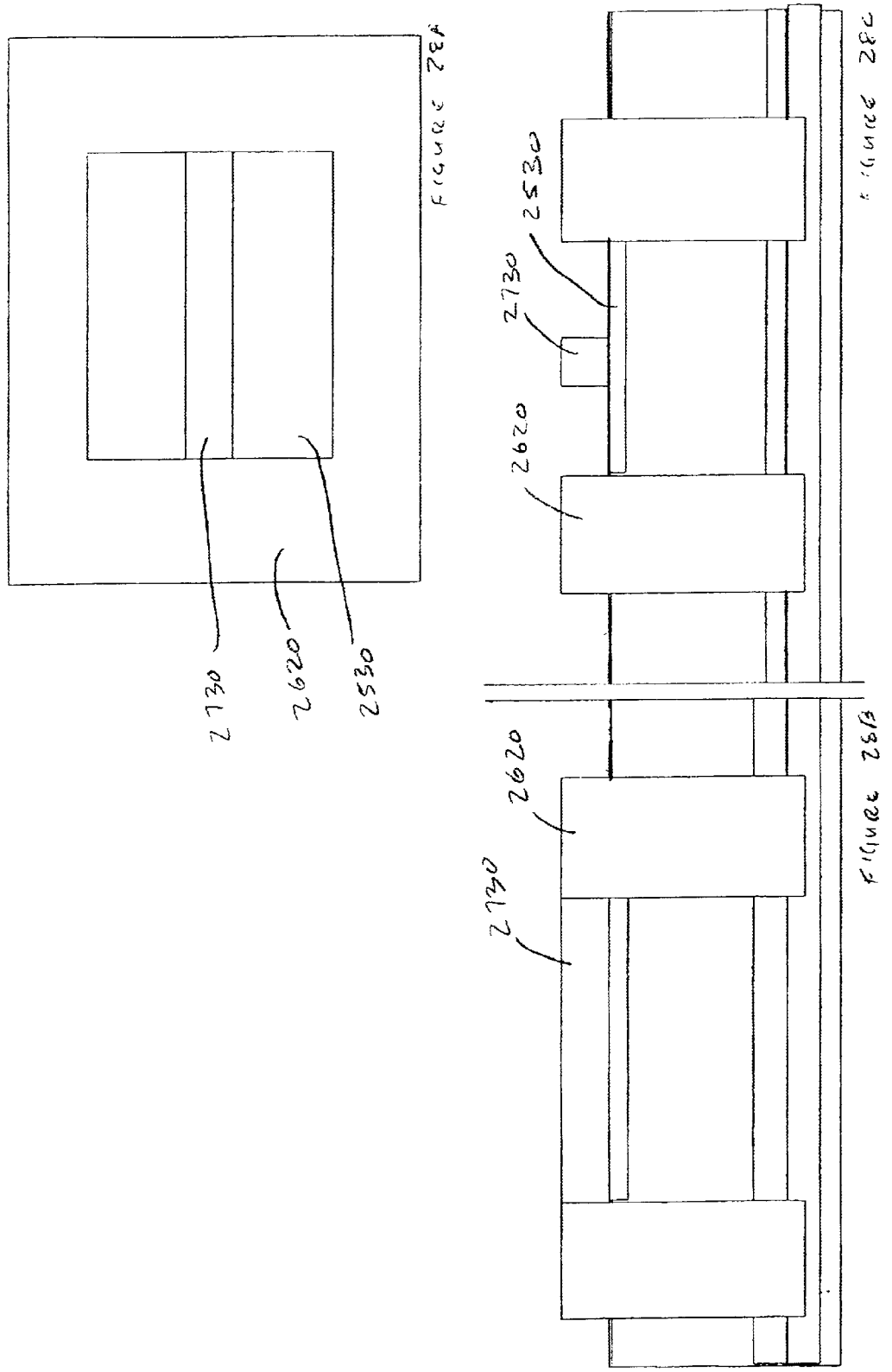

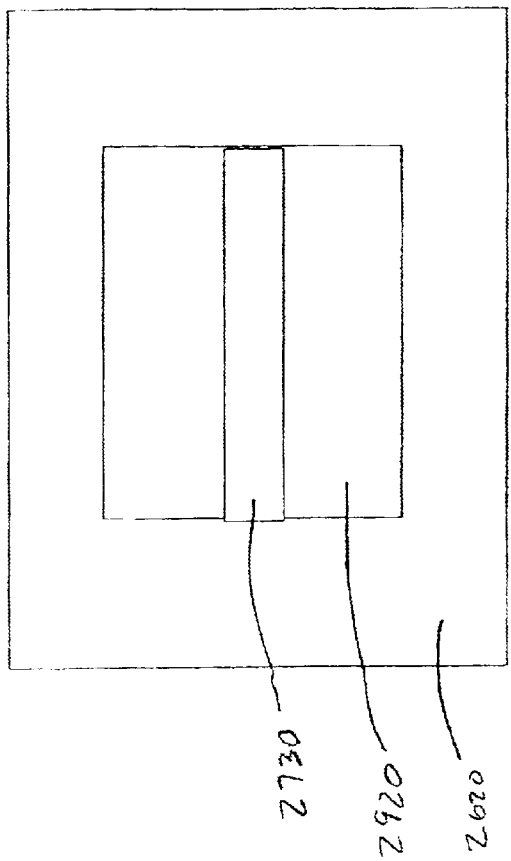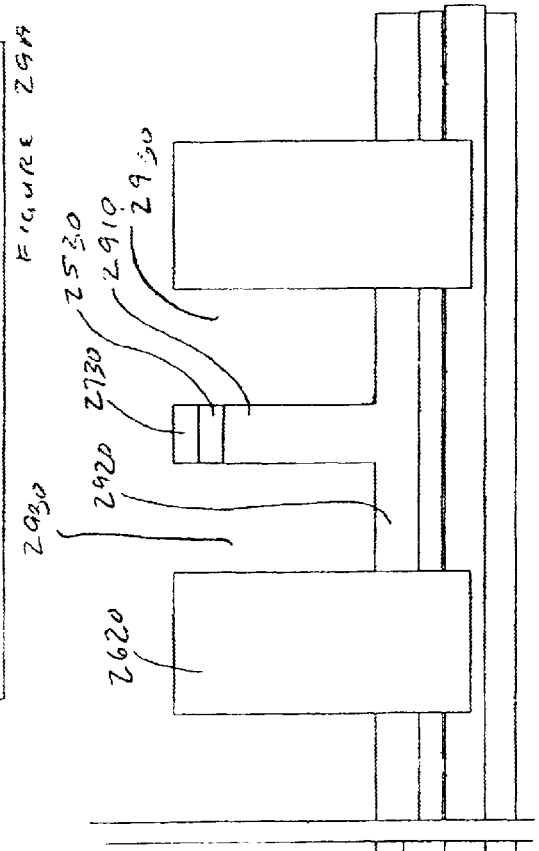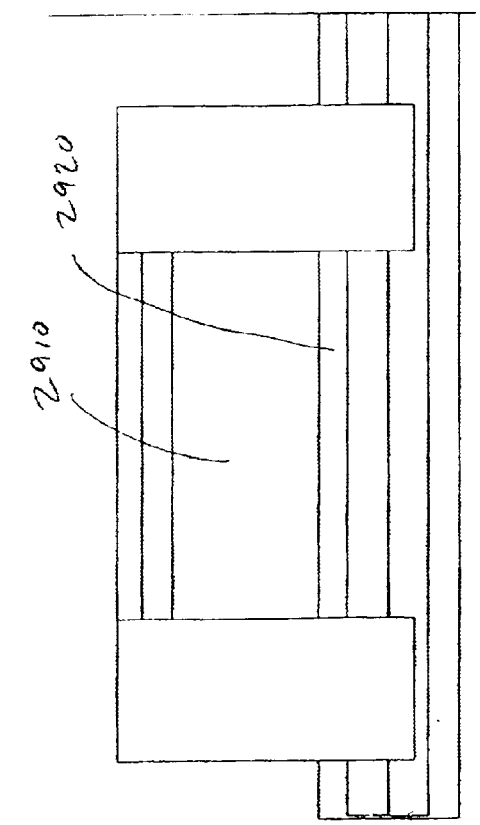

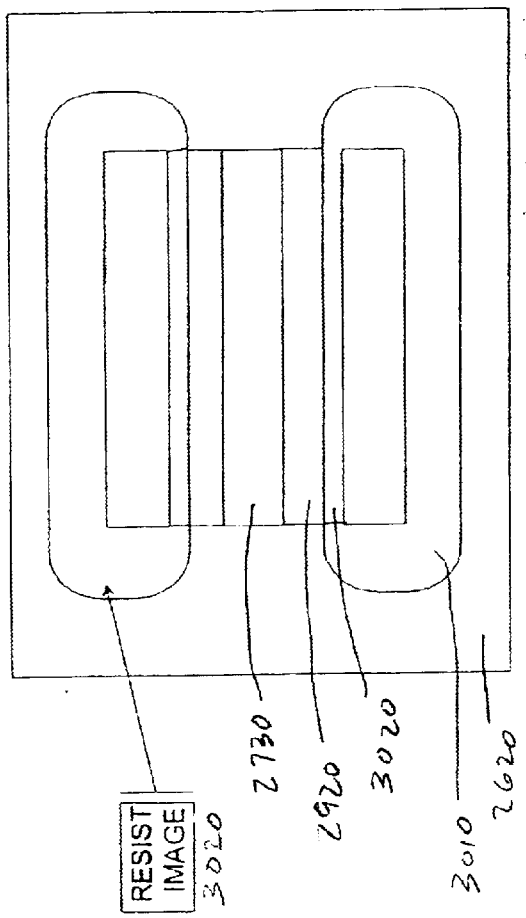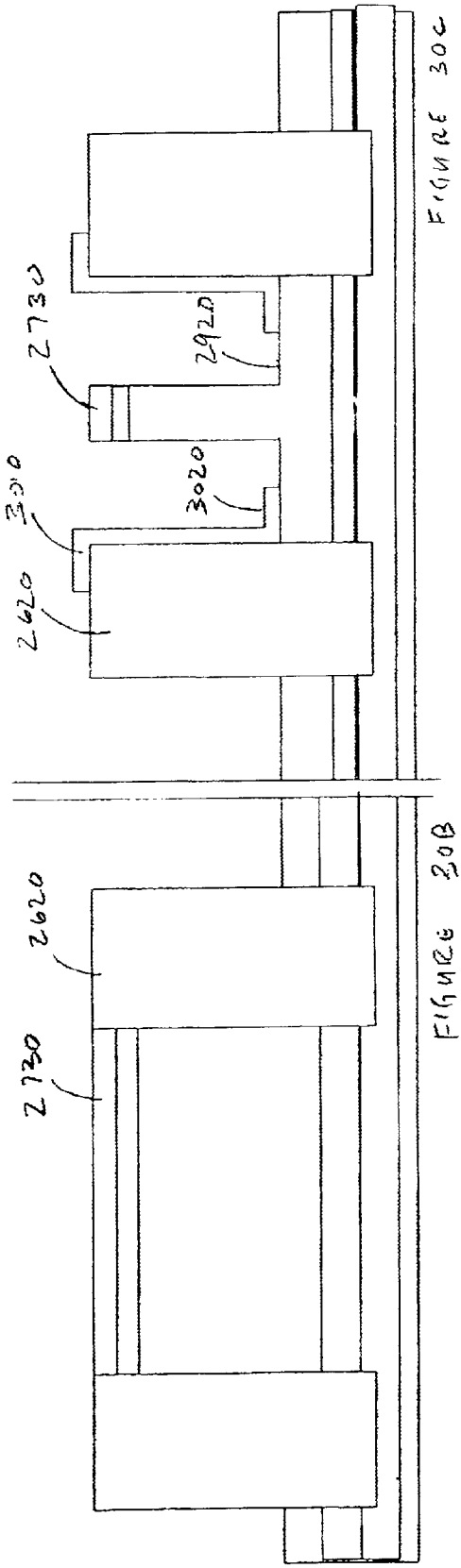

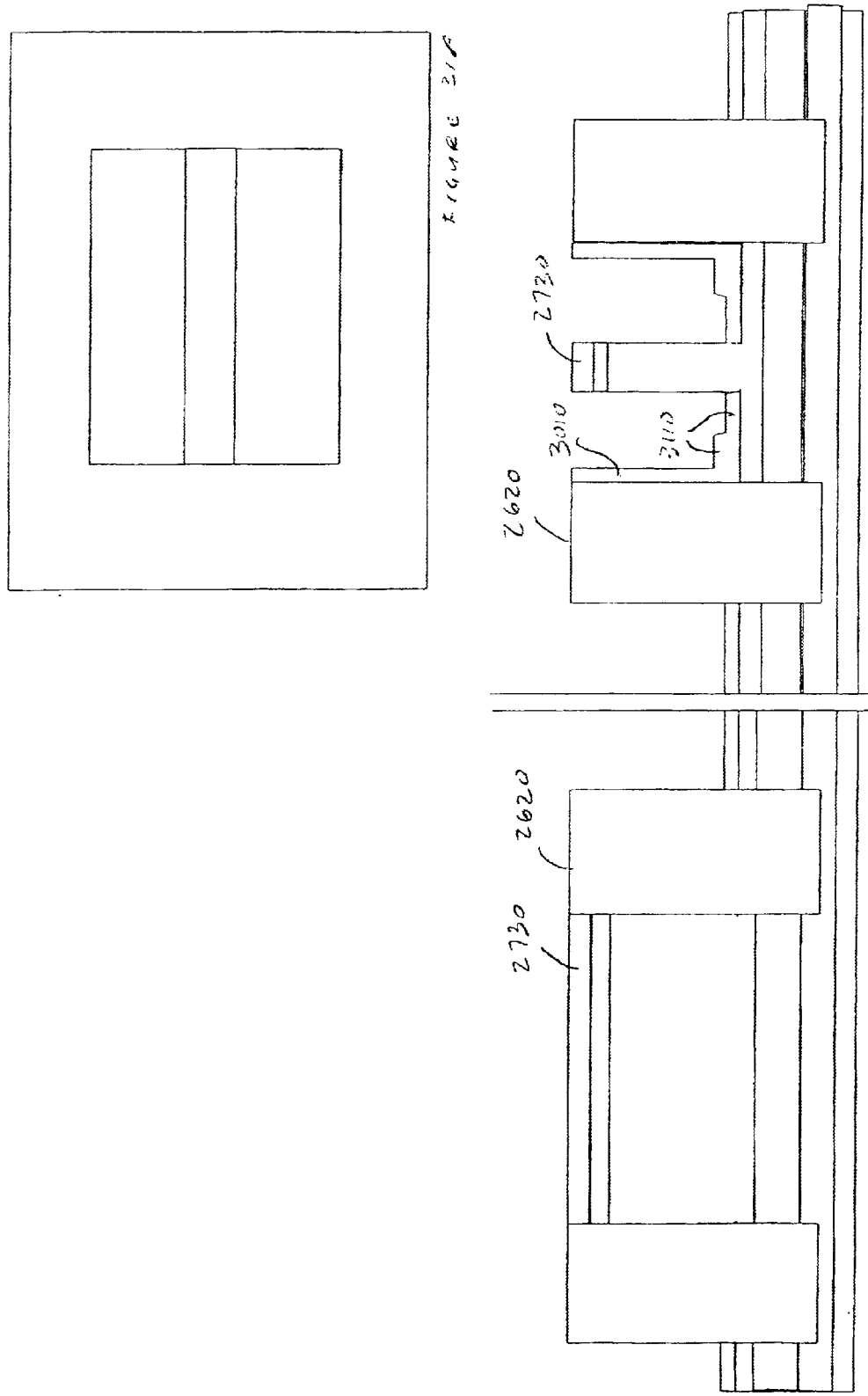

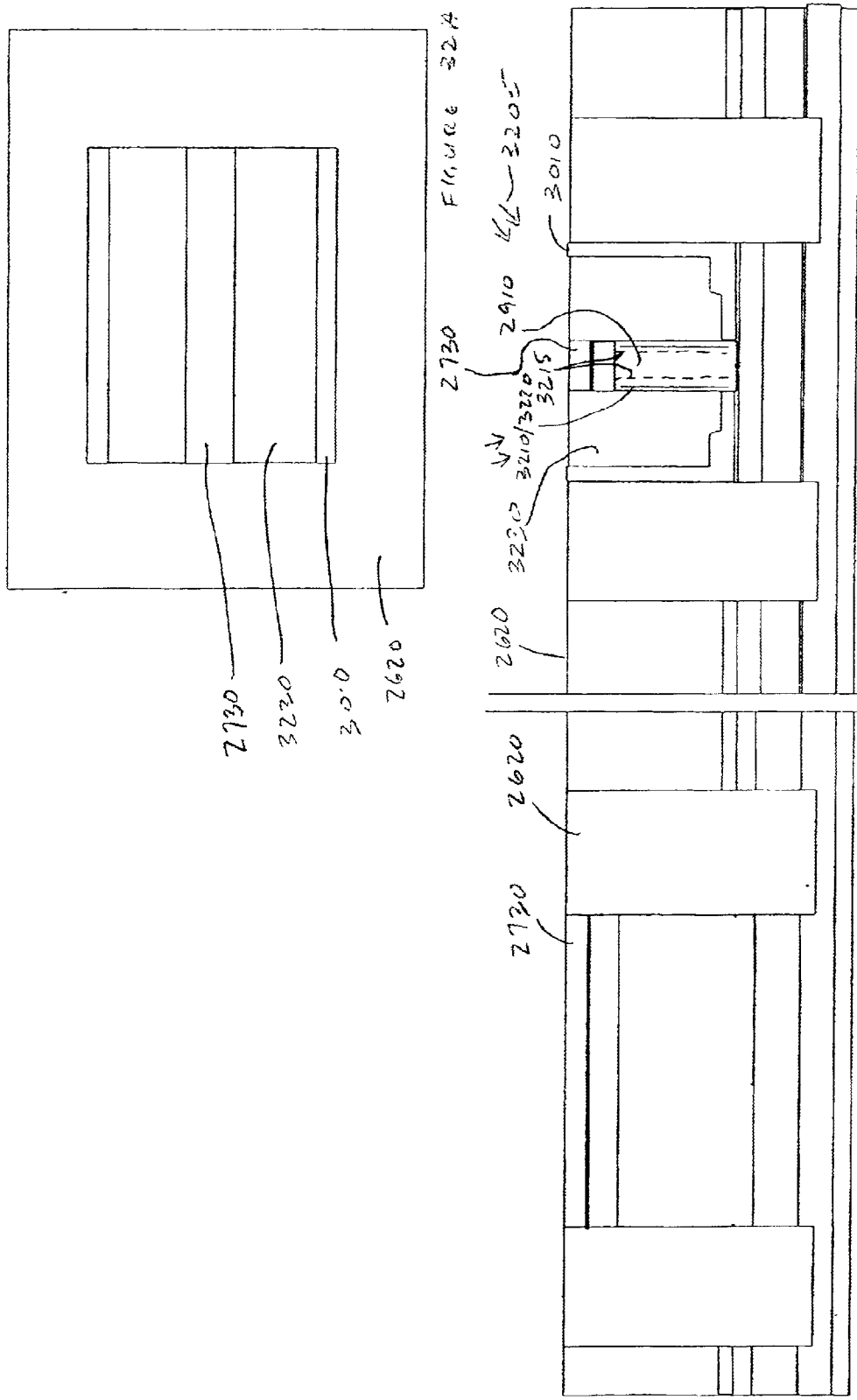

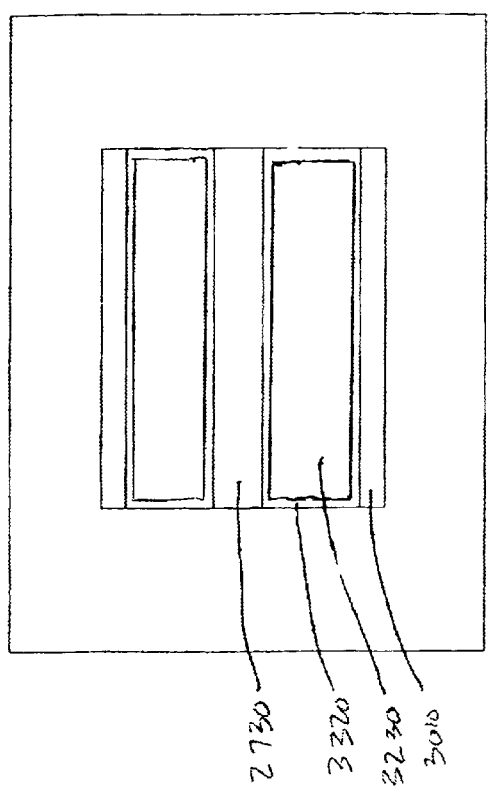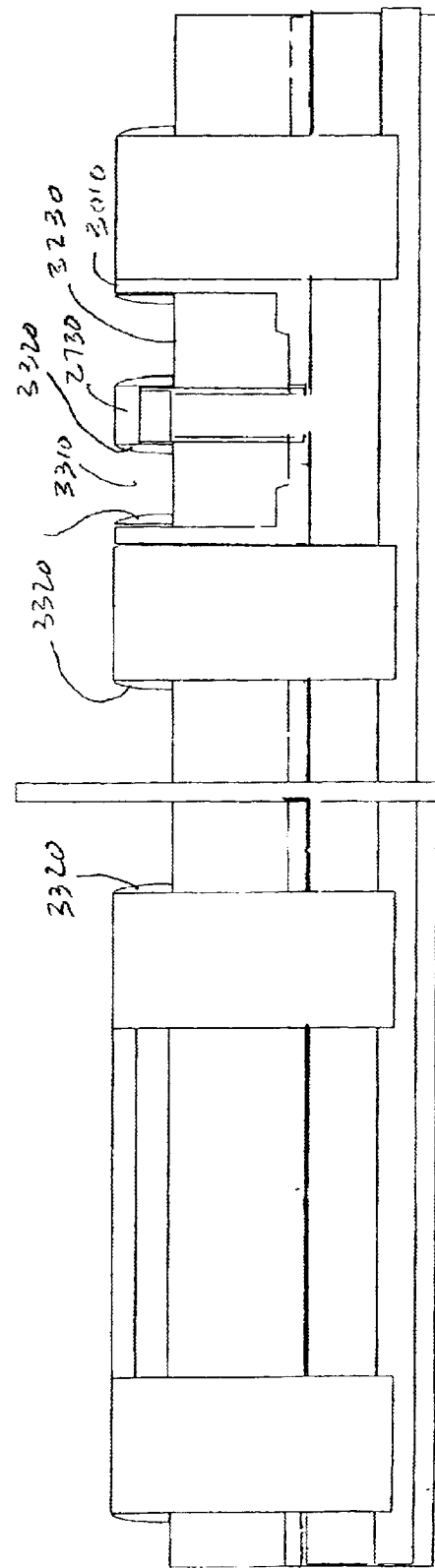

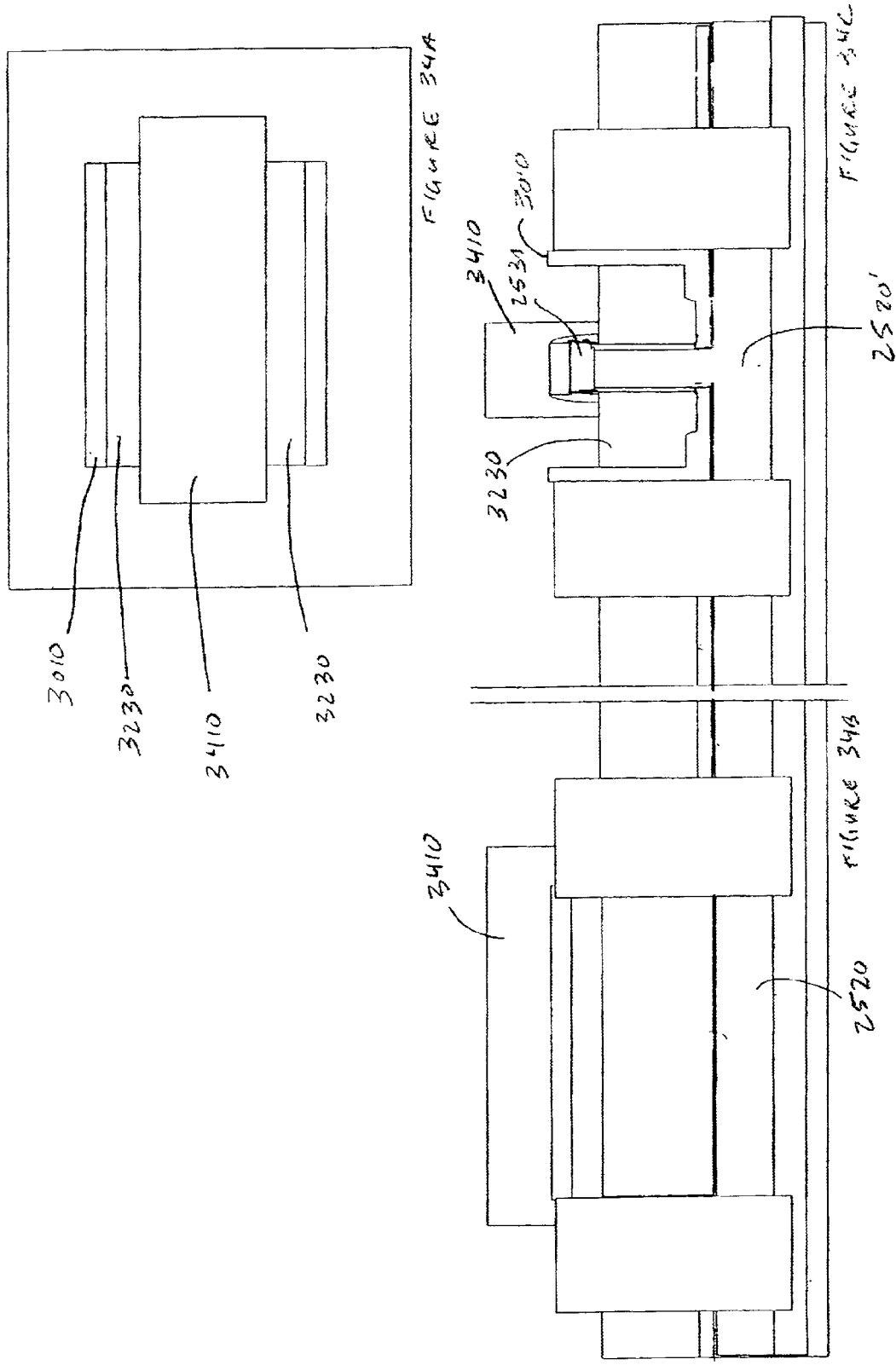

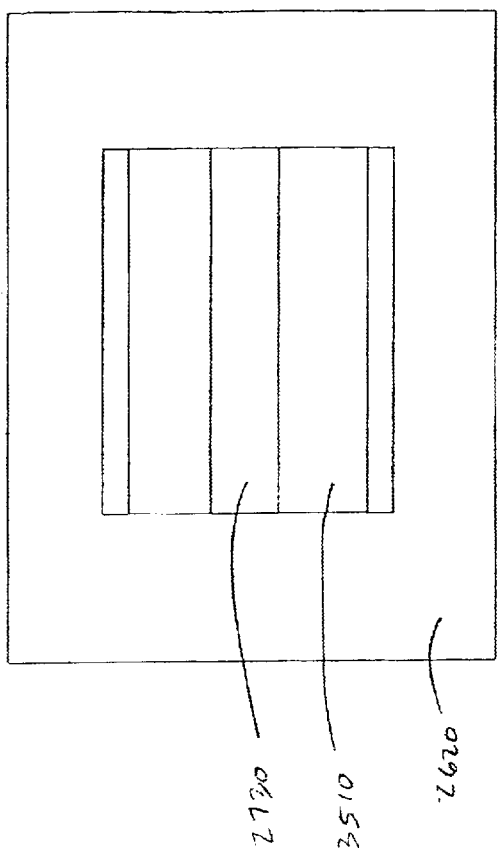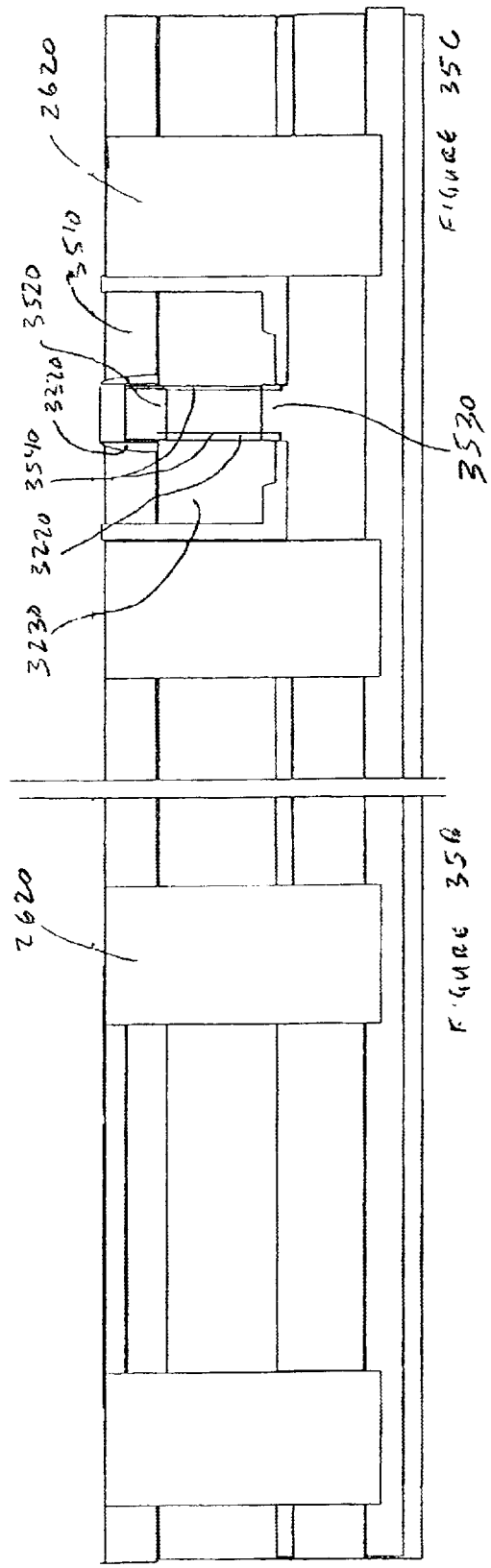

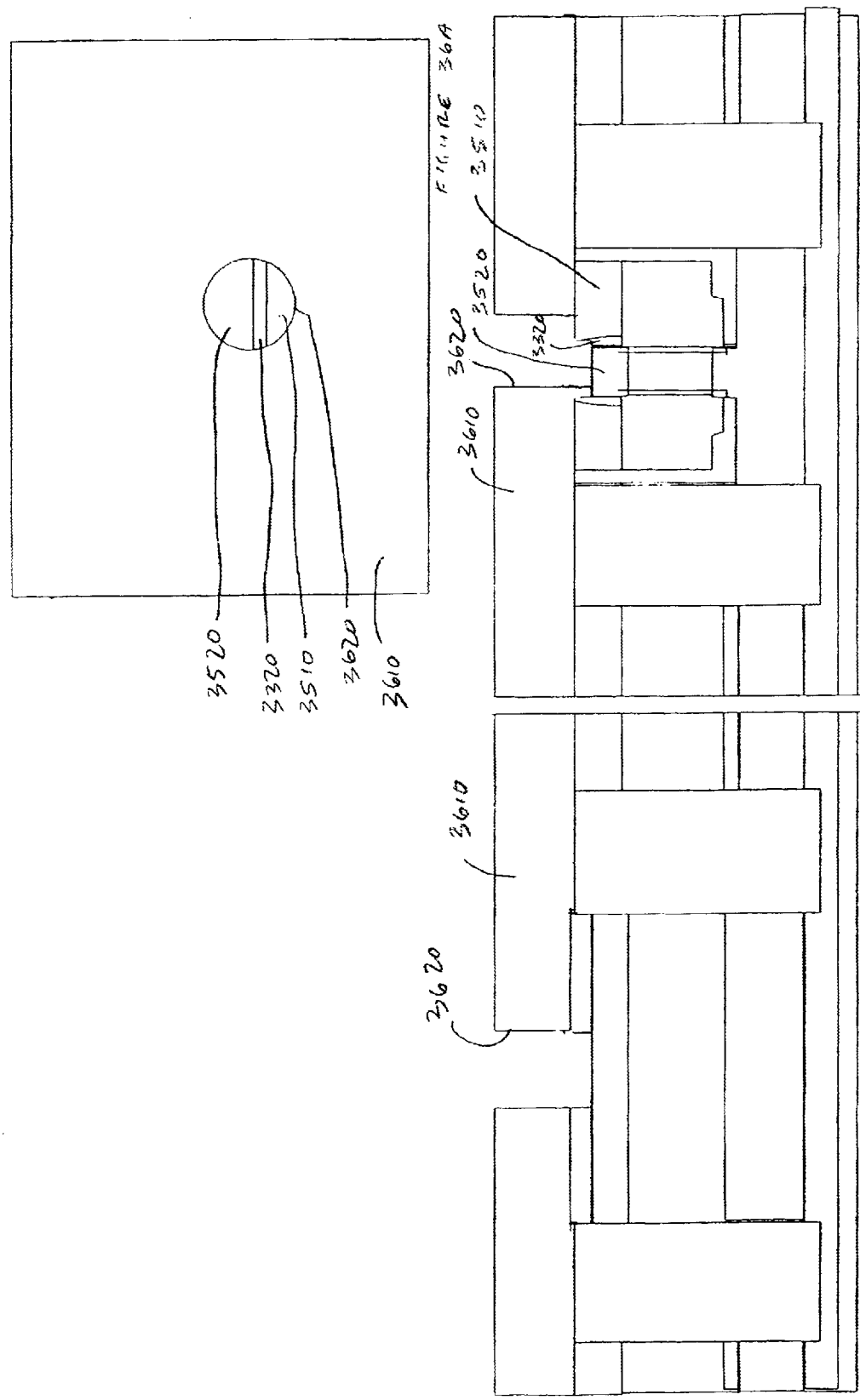

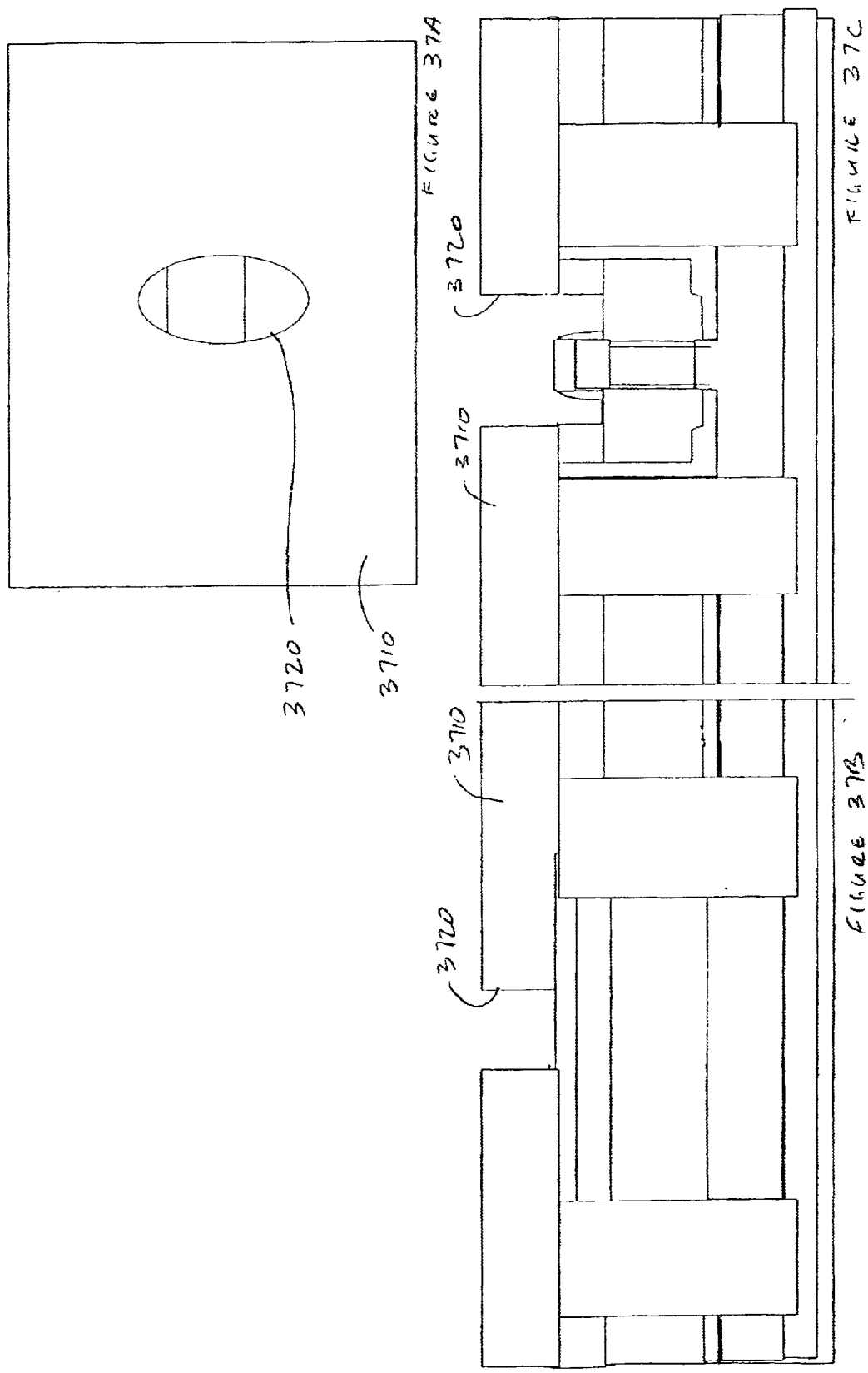

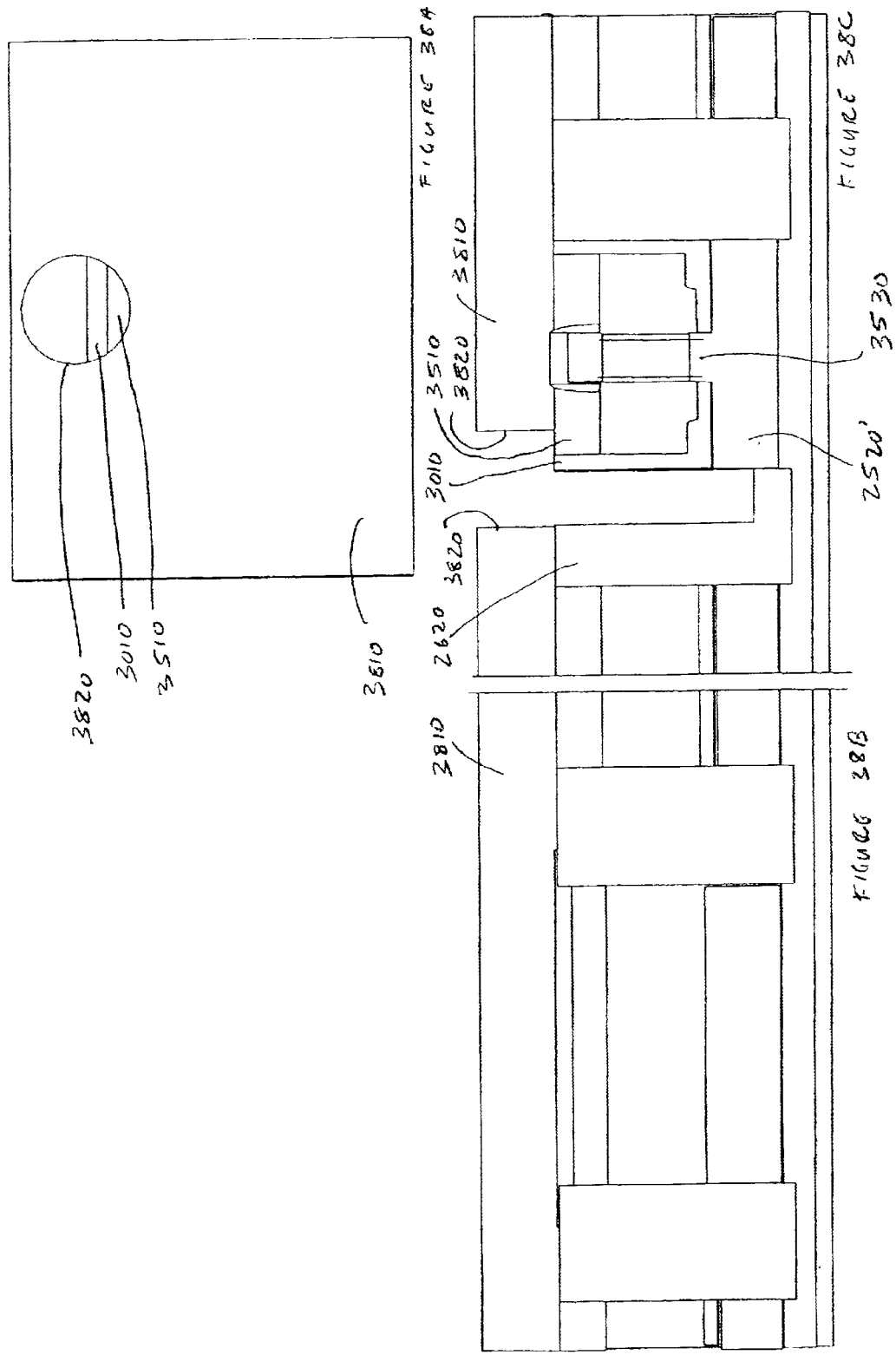

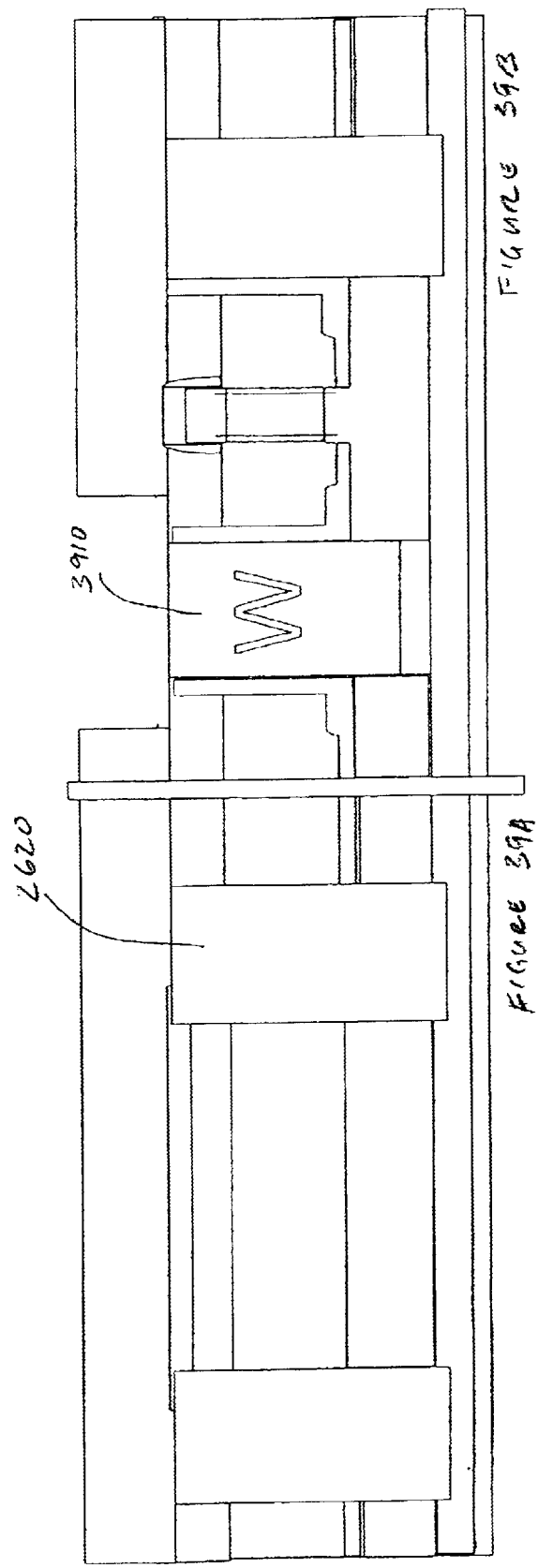

VERTICAL DUAL GATE FIELD EFFECT TRANSISTOR

BACKGROUND OF THE INVENTION

1. Field of the Invention

The present invention generally relates to high performance field effect transistors suitable for extremely high density semiconductor integrated circuits and, more particularly, to dual gate field effect transistors having the source and drain located one above the other and other semiconductor devices having borderless contacts.

2. Description of the Prior Art

Field effect transistors have been known for a number of years and are now the transistor of choice for use in complex integrated digital circuit for all but the most stringent of high frequency requirements. In general, field effect transistors can be fabricated somewhat more simply and with larger process windows than bipolar transistors and, additionally, allow simplified circuit and device design.

As demands for higher digital switching performance have increased, as well as demands for increased functionality and economy of manufacture, constraints on transistor footprint size (and, hence, current-carrying capacity) have also increased. Further, to reduce power dissipation requirements as more transistors are placed within a given chip space and switching and/or clock frequencies are increased, operation at decreased voltages has been required. Operation at reduced voltage tends to reduce operating margins and the difference in resistance between the on and off states of the transistor. This effect is due to the reduced ability to control depletion at greater distances from the gate dielectric within the conduction channel with reduced voltages.

Therefore, there has been recent interest in field effect transistor designs which include gate electrodes on opposite sides of or fully or partially surrounding the conduction channel. Further, from the standpoints of both performance and circuit design and functionality, it has been found to be very desirable to provide for different voltages to be applied to separated gate structures on opposite sides of the conduction channel.

However, providing one or more gate structures on opposing surfaces of the conduction channel or even a single gate structure extending on different sides of the conduction channel implies increased structural complexity of the transistor. This increased complexity cannot always be achieved at sizes the same as or smaller than conventional field effect transistors. For example, several successful designs have been recently achieved using a vertical fin as a conduction channel with gate structures disposed on the lateral sides thereof. However, the conduction path is substantially parallel to the chip surface and, while the designs allow some structures to be formed at sub-lithographic sizes (e.g. smaller than the resolution of the lithography tool used for resist patterning exposures to form other structures), the source and drain must be physically separated from the gate structure; increasing at least one dimension of the transistor footprint.

Additionally, some lithographic techniques to increase resolution of radiant energy lithography tools, such as phase-shift masks, can only form features of closed geometric shape. This limitation often requires an additional "trimming" process to establish, for example, channel length of transistors and generally compromises the ability to maintain tight control thereof.

Further, due to the basic nature of lithography and semiconductor processes, it has been an almost universal practice to configure field effect transistors such that the conduction channel extends substantially parallel to the chip surface. While field effect transistors could, in theory, be configured to have the conduction channel extend substantially perpendicular to the chip surface (e.g. "vertically"), as a practical matter, at least the formation of connections to the source, drain and gate of the transistor are made much more difficult in designs proposed to date; reducing manufacturing yield and consuming substantial chip space as well as greatly increasing process complexity.

SUMMARY OF THE INVENTION

It is therefore an object of the present invention to provide a field effect transistor having dual and potentially independent gate structures of reduced footprint and which can be reliably formed at high integration density by providing a vertically extending conduction channel.

It is another object of the invention to provide a dual gate vertical field effect transistor which can be reliably formed at small size and high integration density by different lithographic techniques.

It is a further object of the invention to provide a vertical field effect transistor design allowing contacts to be conveniently made to the source, gate and drain thereof whereby the contact to the lower diffusion is borderless to the gate.

In order to accomplish these and other objects of the invention, a vertical field effect transistor is provided including a semiconductor pillar conduction channel, gate electrodes in trenches adjacent the semiconductor pillar, a layer of insulator adjacent the gate electrodes and opposite the semiconductor pillar, sidewalls adjacent the semiconductor pillar above the gate electrodes in the trenches, insulator material in the trenches above the gate electrodes and adjacent the sidewalls, the insulator material being selectively etchable relative to the sidewalls and the semiconductor pillar.

In accordance with another aspect of the invention, an integrated circuit device is provided including isolation material surrounding transistor locations in a substrate, vertical field effect transistors formed at the transistor locations and having a gate electrode structure formed in a trench, a layer of insulator material in the trench between the isolation material and the gate electrode structure, the isolation material being selectively etchable relative to the layer of insulator material and a contact opening formed along an interface of the insulator layer and the isolation material.

In accordance with a further aspect of the invention, a method of making a semiconductor device including a field effect transistor is provided including steps of forming a semiconductor pillar in a trench in a body of a first insulating material, the trench extending to a layer of semiconductor material, forming a layer of a second insulating material on walls of the trench, and etching a contact opening to the semiconductor material through the first insulating material selectively and adjacent to the second insulating material.

In accordance with yet another aspect of the invention, a transistor is provided comprising a substrate, a first diffusion, a second diffusion above the first diffusion, a channel extending vertically between the first diffusion and the second diffusion, a gate structure extending on at least one side of the channel, and a contact to the first diffusion borderless to said gate structure.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A, 1B and 1C are plan and cross-sectional views, respectively, of an initial stage of formation of a field effect transistor in accordance with the invention, FIGS. 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B and 24C are plan and cross-sectional views of intermediate stages in the formation of a transistor in accordance with a first embodiment of the invention, and FIGS. 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, 37C, 38A, 38B, 38C, 39A and 39B are plan and cross-sectional views of intermediate stages in the formation of a transistor in accordance with a second embodiment of the invention.

DETAILED DESCRIPTION OF A PREFERRED EMBODIMENT OF THE INVENTION

Referring now to the drawings, and more particularly to FIGS. 1A, 1B and 1C, there is shown an early stage in the manufacture of a transistor in accordance with the invention. It should be noted that throughout the drawings, FIGS. designated 1A, 2A, etc. are plan views of the device at various stages of manufacture while FIGS. 1B, 2B, etc. (a "B" identifier) and 1C, 2C, etc. (a "C" identifier) are sectional views along the sections 1—1 and 2—2, respectively, as shown in FIG. 1A unless other section positions are indicated on the same drawing sheet, such as in FIGS. 22A–24A where different section locations are placed through contacts rather than in the locations shown in FIG. 1A. Additionally, Further, Figures having "B" and "C" identifiers indicate n-type and p-type variants of the transistor in accordance with the invention. Generally both of these variants will be formed at different locations on the same wafer or chip, in sequence and in accordance with block-out masking as is well-understood in the art. Accordingly, it should be understood that the area depicted in the plan view (an "A" identifier) indicated the area of the wafer involved in fabrication of the transistor in accordance with the invention and the lateral dimensions of the sectional views ("B" and "C" identifier, as depicted, may be larger indicating surrounding regions of the wafer beyond the area depicted in plan views. Otherwise, dimensions of features depicted in the cross-sectional views generally correspond to the dimensions of features as depicted in the plan views but are not to scale.

Starting with a silicon on insulator wafer 100 a screen oxide 110 is formed, preferably by heat treatment and a resist 120 is applied to the entire wafer. This resist is first patterned (140) in the PMOS source region and boron is implanted in accordance with the patterning at an energy level which will provide a buried implanted region 160. The screen oxide 110 is useful in regulating ion implantation depth by effectively randomizing ion trajectory and implantation direction. The patterned resist is then stripped and another similar resist layer 130 is applied and patterned (150) in the NMOS source region. Arsenic is then implanted to form a similar buried region 170 resulting in the structure illustrated in FIGS. 1A–1C.

To form the structure shown in FIGS. 2A–2C, the screen oxide 110 may be stripped and replaced by a pad oxide 110', if desired. Generally it is preferable to replace the screen oxide 110 to avoid the possibility of compromise by implantation damage. Then, a thick layer of germanium oxide 210 is deposited followed by a layer of silicon nitride 220. The thickness of the germanium oxide is a key parameter for channel length control as will be evident to those skilled in the art from the discussion below. Then, as shown in FIGS. 3A–3C, a resist 310 is applied and patterned (315) and the nitride and germanium oxide layers etched to form the transistor regions 330 and define channel width and transistor current. These materials are sacrificial and chosen due to differential selective etch rates that can be achieved relative to other materials in the transistor structure. Other appropriate materials will be evident to those skilled in the art.

Then, the etched regions are oxidized and filled with silicon oxide or other desired shallow trench isolation (STI) material 410. The surface is then planarized by chemical/mechanical polishing back to the nitride polish stop surface 420 of a remaining portion of nitride layer 220, resulting in the structure shown in FIGS. 4A–4C.

Referring now to FIGS. 5A–5C, the position of a mold for forming the vertical silicon pillar which will form the vertical conduction channel of the transistor is defined by application of a resist 510 The resist is then exposed using a hard phase shift mask or other lithographic process or other process techniques such as spacers to control width and developed to form a narrow (possibly of sub-lithographic width) linear pattern 520 across the non-STI region. Then, in accordance with the patterned resist, the nitride, $GeO_2$ and pad oxide are etched selectively to fill 410 to the original silicon wafer surface 620 to form the pillar mold 610, as shown in FIGS. 6A–6C, and the resist stripped. The silicon pillar 710 is then epitaxially and selectively grown from the original silicon wafer surface 620 to fill the mold 610 arid the surface planarized to result in the structure shown in FIGS. 7A–7C. If pattern 520 is of sub-lithographic width, as can be achieved by, for example, a phase shift mask the pillar/conduction channel Will be of corresponding sub-lithographic dimensions.

To protect the silicon pillar, the top of the silicon pillar is recessed by etching the silicon to form a recess which is then filled or a film formed with TEOS oxide or LPCVD oxide 810 and the surface again planarized by chemical/mechanical polishing to result in the structure shown in FIGS. 8A–8C. Then, as shown in FIGS. 9A–9C, the remaining surface nitride 220 (FIGS. 8A–8C) is stripped, preferably by a wet etch, and the remaining $GeO_2$ 210 (FIGS. 8B–8C) is removed with a water rinse.

A conformal layer of nitride 910 is then applied, preferably by chemical vapor deposition and covered by a resist 920 which is patterned in the region surrounding the nitride covered silicon pillar 710. This nitride is used later to facilitate borderless contact formation, as will be discussed in greater detail below. Then, as shown in FIGS. 10A–10C, the conformal nitride layer 910 is isotropically etched in accordance with the patterned resist 920 to partially open (1010) the nitride 925 at the bottom of the trench adjacent to the silicon pillar, the resist is stripped. Removal of nitride adjacent the pillar at 1010 controls the location from which impurities will be diffused to form an extension impurity region.

At this point, a block-out mask 1130 is applied to mask the NMOS transistors while the PMOS transistors are processed. Similar processing will thereafter be performed for the NMOS transistors while the PMOS transistors are masked with a similar block-out mask. The order of NMOS and PMOS processing is not important to the successful practice of the invention. Referring now to FIGS. 11A–11C, a layer of borosilicate glass (BSG, or arsenic silicate glass, ASG) 1110 is anisotropically deposited, preferably by plasma vapor deposition, leaving a layer 1110 in recess 1010 and covering the termination of nitride 925 and other horizontal surfaces with layers 1230.

This operation is followed by a similar process to deposit a $SiO_2$ spacer 1120 covering the BSG 1110 to separate the drain structure from the gate along the pillar followed by a dip-out process, if necessary, to remove residual sidewall deposits. The resulting structure is then covered by a block-out mask of resist 1250 similar to 1130 and blocking layers 1140 and 1150, as shown in FIGS. 12A–12C. The NMOS (or PMOS) transistor sites are then opened by a lift-off glass technique dissolving layer 1130 and arsenic silicate glass (ASG, or borosilicate glass, BSG) 1210 deposited, again preferably by ionized plasma vapor deposition or PECVD (which preferentially deposits material on horizontal surfaces) followed by deposition of an $SiO_2$ spacer and dip-out, if necessary. This process also provides similar layers 1230, 1240 on the top of silicon pillar 710 and surrounding the transistor site as well as on the surface of the resist 1130. The deposits on the resist are removed by a lift off glass process, resulting in the structure shown in FIGS. 13A–13C.

Then, as shown in FIGS. 14A–14C, a sacrificial oxide 1430 is formed on exposed silicon surfaces and stripped. The gate dielectric 1420 is formed self-aligned with the channel by either oxidation or CVD, atomic layer epitaxy or the like that may completely surround the channel. At this point, a heat treatment can be performed to move the out-diffused dopant regions 1410 from the ASO and BSG to form the drain in the lower part of the transistor. This out-diffusion must eventually reach the implanted regions 160, 170, respectively. The trench 1430 is then filled with a gate material (self-aligned with the channel. and gate dielectric) such as polysilicon to create gate electrodes 1440 (FIG. 15A–15C) that are initially joined forming an interior wall completely surrounding the channel but which can be later separated by polishing gate 1440 and residual dopant films such as 1440 that are still present down to nitride 910, recessing the gate material at 1510, and depositing nitride. 1550 in the recess, as shown in FIG. 15A–15C. Then the gate material is further recessed at 1510 and TEOS is deposited and then etched to form sidewall spacers 1520.

Then, as shown in FIGS. 16A–16C resist is again applied and patterned to form a mask 1610 over the upper portion of the silicon pillar 710, cap oxide 810 and layers 1230, 1240. Then, isotropic etching is performed in accordance with mask 1610 which serves to remove sidewall spacers 1520 that are not adjacent the silicon pillar 710. The mask 1610 is then stripped and nitride is deposited in the recesses over the polysilicon, as shown at 1710 in FIGS. 17A–17C and etched and/or polished to remove surface regions of nitride layer 910 and form a planar surface. Use of nitride allows selective etching of the cap oxide 810 and layers 1230, 1240. A resist 1810 is applied, as shown in FIGS. 18A–18C and developed to form a PMOS drain implant mask with apertures 1910, as shown in FIGS. 19A–19C. The implantation process depicted at 1920 produces a doped region 2010 shown in FIG. 20C.

The implantation process is completely independent of the drain doping described above which may be advantageously exploited in order to individually tailor the source and drain characteristics such as for providing asymmetry in the transistor. The resist is then stripped, oxide or TEOS 2020 (FIG. 21) deposited in the remaining recess and the surface replanarized.

As shown in FIGS. 21A–21C, a nitride etch stop layer 2110 and an oxide inter-layer dielectric layer 2120 are deposited in sequence over the entire device surface. Then, as shown in FIGS. 22A–22C (FIG. 22C being a cross-section at section 3—3 of FIG. 22A), source contact openings 2210 are etched using a patterned resist. This etch first etches oxide 2120 stopping on the nitride 2110, the nitride 2110 is then selectively etched stopping on the oxide cap 2020 and the oxide cap 2020 etched stopping on the implanted region 2010 of the silicon pillar 710. It should be noted that the diffused regions 1410 have now reached implanted drain regions 160/170 through the heat budget of the processes of FIGS. 15A–15C to 22A–22C although additional annealing could be performed, as well.

FIG. 23C shows a cross-section of the device at section 4—4 of FIG. 23A. The gate contact opening is selectively etched in stages as before (etch of oxide 2120 stopping on nitride 2110, then etch nitride 2110 and 1710 selectively to oxide thereby making gate connections on both sides of the channel or source region) except that the oxide cap 2020 is not etched and the opening 2310 is wider than the oxide cap 2020 or separate openings made at either side of the oxide cap 2020 as shown by dashed lines 2320. Either contact structure is thus borderless to the source diffusion. Similarly, source contact opening 2330 is formed by selective etching but etching through the oxide cap to contact implanted region 2010 but terminating the etch above the gate structure such that the source contact is borderless to the gate structure. Two separate contacts can contact each of the gate regions 1440 independently.

FIG. 24C shows a cross-section of the device at section 5—5 of FIG. 24A and which may or may not coincide with section 3—3 of FIG. 22A. Again, the opening for the drain contact (behind the plane of the page of FIG. 24B) is performed selectively in stages to open the side of the drain structure. However, in this case, after the nitride etch stop is opened, the selective oxide etch is, in essence, guided by nitride layer 910 which also serves to insulate the contact from the gate electrode forming a borderless contact in which a contact can be made to a structure without providing an insulator over adjacent or underlying structures by forming a contact opening in or along an existing insulator. The transistor can then be completed by depositing metal or polysilicon in the source, gate and drain openings and planarizing the surface.

Thus, it is seen that the invention provides a vertical conduction channel field effect transistor having a dual gate located on opposite sides of the conduction channel and the source and drain located one above the other to provide a footprint of decreased size. In fact, the only limitation on scaling to very small sizes is the need to lithographically define the pattern for the silicon pillar which, in turn, is generally limited by the resolution of the lithographic exposure tool. (While the pillar can be made narrower by various lithographic enhancements or process techniques such as sidewalls, the overall footprint is generally limited to the resolvable lithographic feature size.) Even this limitation can be partially avoided by phase-shift exposure techniques such as will now be explained with reference to a preferred embodiment of the invention.

Additionally, this preferred embodiment is self-trimming and borderless at the interface with shallow trench isolation structures and, in essence, the etched and deposited STI structure is used as a trim mask and selective etching limits trench/pillar length. The contact to the lower diffusion is borderless to the gate electrode, the contact to the gate extends above and on two sides of the upper/second/source diffusion, separate gate contacts can be formed on two or more different sides of the channel, and the contact to the second diffusion is borderless to the gate structure. Further, the lower/drain diffusion extends below the pillar and extends beyond the pillar below the gate structure for formation of a contact adjacent the gate structure while an insulator adjacent the gate structure allows a contact to be formed by a conductive layer adjacent thereto. Moreover, a contact to the upper diffusion can be in the form of a self-aligned spacer, the pillar extends above the gate structure and the first diffusion can be used to form a contact to a portion of a further transistor as will be discussed in greater detail below in connection with a second embodiment of the invention. It should also be appreciated that, in the first embodiment described above, the pillar forming the conduction channel is epitaxially grown in a recess while, in the second embodiment, the pillar is formed by etching.

Turning now to FIGS. 25A–25C to FIGS. 38A–38C, a second embodiment of the invention will now be discussed. Some differences in detail will differ from the first embodiment of the invention described above as will be evident and some of which may be substituted for processes in the first embodiment and vice-versa. For example, the self-aligned source and drain process described above can be employed in the second embodiment and a further description thereof is omitted for clarity. The principal difference between the first and second embodiments of the invention is the nature of the process used to form the trench 2720 which will provide a pattern for the conduction channel at the step shown in FIGS. 27A–27C.

More specifically, the trench 2720 is formed, in accordance with the second embodiment using a phase-shift mask which allows smaller feature sizes to be lithographically defined using electromagnetic energy of a given wavelength. As will be apparent to those skilled in the art, such a technique for forming the trench, in the absence of trimming using additional lithographic processes, will result in a trench having a closed geometric shape; only a portion of which is shown. Other transistors may be simultaneously or sequentially formed at other locations along this closed geometric shape. This feature of the second embodiment of the invention, in particular, facilitates formation of transistors in accordance with the invention in pairs which may be opposite conductivity types (e.g. for inverters).

As shown in FIGS. 25A–25C, the second embodiment illustrates use of a SOI wafer having an active silicon layer 2510 with lower drain diffusions 2520, 2520' of differing conductivity types already in place. A resist is applied and patterned and a PMOS source region 2530 is implanted. The resist is then stripped and another resist is applied and patterned and an NMOS source region 2540 similarly implanted. A similar process is used for the other polarity device. A screen oxide can be used and stripped for the impurity implant in either case. The wafer surface is then covered with a pad oxide layer 2550 and a nitride layer 2560.

As shown in FIGS. 26A–26C, respective transistor areas are defined lithographically and etched to form shallow trenches in regions 2610 which are then filled with an oxide or other insulator 2620, preferably by chemical vapor deposition (CVD) and the surface polished to nitride 2560. As shown in FIGS. 27A–27C, a resist 2710 is applied and patterned, preferably using a phase-shift mask, to allow selective etching of a narrow trench 2720 to the source implant 2530 corresponding to the location of the pillar/conduction channel shape. The resist is stripped and this trench is then filled with CVD TEOS 2730 and polished back to the level of nitride 2560, as shown in FIGS. 28A–28C, remaining surface nitride 2560 is removed by wet etching selectively to oxide. The pad oxide 2550 is then removed to the implanted source region 2530 by a brief etch selective to silicon which leaves most of the thicker TEOS and shallow trench oxide 2620 intact (e.g. reduced in height/thickness), resulting in the structure shown in FIGS. 28A–28C.

As shown in FIGS. 29A–29C, silicon is anisotropically etched selectively to oxide to form the silicon pillar 2910. This is preferably performed as a timed etch to leave a portion 2920 of the silicon layer of the original wafer in place at the bottom of trenches 2930 overlying lower diffusions 2520, 2520'. A layer of nitride 3010 is then deposited and patterned by isotropic etching in accordance with a patterned resist 3020 to cover the edges of the shallow trench isolation structures 2620 and extending partially over the trench bottoms 2920 at 3020, as shown in FIGS. 30A–30C. (It will be recognized that this structure is substantially the same as that of FIGS. 10A–10C except that the extent of the nitride coverage outside the trenches is different. Thus, the processes of FIGS. 25A–25C to 30A–30C could be substituted for those of FIGS. 1A–1C to 10A–10C and vice-versa utilizing different nitride patterning.)

As shown in FIGS. 31A–31C, additional nitride is anisotropically deposited and isotropically etched such that deposited nitride is stripped from the trench walls adjacent the silicon pillar. Nitride 3010 is returned to approximately its original thickness on the side walls while nitride 3110 is provided at the trench bottom to provide separation of the gate structure (to be formed as shown in FIGS. 32A–32C) from the drain. Nitride is removed from the surface by polishing. Sacrificial oxide 3210 is grown on the silicon pillar surface (for cleaning the surface when the oxide is removed) and an angled channel implant 3205 can be performed to provide surface impurities on the sides of the silicon pillar 2910, as indicated by dashed lines 3215. This implant, regulated by the sacrificial oxide, is used to pre-dope the channel because the pillar is formed by etching rather than growth during which impurities could be incorporated. A similar process could be exployed at the corresponding point in the first embodiment. The sacrificial oxide 3210 is then stripped. Gate oxide or other insulator 3220 is then formed in the location of the removed sacrificial oxide, preferably by a brief heat treatment in an oxygen-containing atmosphere and the trenches re-filled with conductive gate material 3230, resulting in the structure shown in FIGS. 32A–32C.

The gate material is then recessed at 3310 by selective etching and oxide is deposited and etched to form sidewall spacers 3320 as shown in FIGS. 33A–33C. Spacers which are adjacent the STI are removed by selective etching in accordance with a lithographically defined cap mask 3410, as shown in FIGS. 34A–34C. This process is similar to that described above in connection with FIGS. 16A–16C. The resist mask 3410 is then stripped. As shown in FIGS. 35A–35C, recesses above the gate material 3230 are filled with nitride 3510 and polished back. Implanted or diffused impurity regions 2520, 2520' and 2530 are then expanded at 3520, 3530, by heat treatment into the conduction channel region of silicon pillar 2910 while implanted impurities 3215 in the pillar are diffused within the pillar. It should be noted that this diffusion is insulated from the gate polysilicon 3230 by the gate oxide 3220 at the lower diffusion 3530 (2520, 2520') and by sidewalls 3320 (and the gate oxide 3220) at the upper diffusion 3520 (2530).

Source, gate and drain contact openings 3620, 3720 and 3820 are formed as shown in FIGS. 36A–36C, 37A–37C and 38A–38C using resists 3810, 3710 and 3810, respectively, in a manner similar to that discussed in detail above in connection with FIGS. 22A–22C, 23A–23C and 24A–24C. Again, the drain contact opening is formed by a selective etch of the oxide of the STI structure and follows the nitride sidewall 3010 at the interface with the STI material. Also, as with the first embodiment of the invention, the gate and source contact openings may be kept separated by selective etching of nitride and/or oxide and lithographic patterning registration is not critical even at the extremely small sizes to which the transistor may be scaled by the phase-shift mask patterning and/or other lithographic or process techniques alluded to above in accordance with the second embodiment of the invention.

Alternatively, as is often the case, it may be desirable to form a single contact to drains of two adjacent transistors or (e.g. as an output connection for an inverter circuit) the transistor drain and an electrode of any other type of adjacent device. In such a case, shallow trench isolation is not required between the transistor and another transistor or other device (which are, in any case, insulated by nitride sidewalls 3010) and the entire width of the STI structure may be etched and the recess filled with conductor 3910 such as tungsten as shown in FIGS. 39A and 39B. All of the above-description connections are borderless as in the first embodiment of the invention.

In view of the foregoing, it is seen that the invention provides a vertical field effect transistor structure which has dual, potentially independent gates and which can be formed in an extremely small area of a wafer. Source, gate and drain connections may be formed reliably and with relatively large lithographic exposure registration tolerances providing high manufacturing yield.

While the invention has been described in terms of two preferred embodiments which are, in part, interchangeable, those skilled in the art will recognize that the invention can be practiced with modification within the spirit and scope of the appended claims.

Having thus described my invention, what I claim as new and desire to secure by Letters Patent is as follows:

1. A transistor comprising
   a substrate,
   a first diffusion region,
   a second diffusion region above said first diffusion region,
   a channel extending vertically between said first diffusion region and said second diffusion region,
   a gate structure extending on at least one side of said channel, and
   a contact to said first diffusion region borderless to said gate structure.

2. A transistor as recited in claim 1, wherein said transistor is a vertical transistor and wherein said first diffusion region is formed in said substrate and said second diffusion region is formed on the channel.

3. A transistor as recited in claim 2, wherein a contact to said gate structure extends above and on two sides of said second diffusion region.

4. A transistor as recited in claim 2, further including separate contacts to separate portions of said gate structure on different sides of said channel.

5. A transistor as recited in claim 1, wherein said gate structure extends on two sides of said channel.

6. A transistor as recited in claim 1, wherein said gate structure extends on at least three sides of said channel.

7. A transistor as recited in claim 1, further including a contact to said second diffusion region borderless to said gate structure.

8. A transistor as recited in claim 1, wherein said transistor comprises a pillar of single crystal silicon having an edge.

9. A transistor as recited in claim 8, wherein said pillar comprises said first diffusion region said channel and said second diffusion region, said gate structure extending adjacent said pillar.

10. A transistor as recited in claim 9, wherein said first diffusion region extends into single crystal silicon beneath said pillar and extends below said gate structure for formation of a contact adjacent said gate structure.

11. A transistor as recited in claim 9, further comprising an insulator adjacent said gate structure, wherein said contact to said first diffusion region comprises a conductive layer adjacent said insulator.

12. A transistor as recited in claim 9, wherein a contact to said gate structure is borderless to said second diffusion region.

13. A transistor as recited in claim 9, wherein said contact to said second diffusion region extends adjacent to a spacer which is self-aligned to said edge.

14. A transistor as recited in claim 9, wherein said pillar extends above said gate structure.

15. A transistor as recited in claim 1, further comprising an isolation structure, wherein said transistor is self-aligned to said isolation structure.

16. A transistor as recited in claim 1, further comprising a contact between said first diffusion region and another diffusion region forming part of a second transistor, wherein said contact between said first diffusion region and said another diffusion region extends over an area of insulation between said first transistor and said second transistor.

17. A transistor as recited in claim 16, wherein said insulation comprises an etched and deposited isolation structure.

18. A transistor as recited in claim 17, wherein said substrate comprises silicon-on-insulator having buried oxide isolation and wherein said insulation comprises said buried oxide isolation.

19. A transistor as recited in claim 16, wherein said first transistor and said second transistor comprise an inverter and wherein said contact to said first diffusion region is a contact to said inverter.

20. A transistor as recited in claim 1, wherein said gate structure comprises a continuous interior wall entirely surrounding said channel and spaced therefrom by a dielectric layer.

21. A transistor as recited in claim 1, wherein said gate structure is self-aligned to said channel.

22. A transistor as recited in claim 1, wherein said first diffusion region comprises a dopant species provided separately from said second diffusion region.

23. A transistor as recited in claim 1, wherein said channel is of sublithographic width.

24. A transistor as recited in claim 1, wherein said first diffusion region includes
   top and side surfaces covered by a dielectric material,
   a borderless opening at least through a portion of the dielectric material on said top surface, and
   a first diffusion contact formed in the opening.

25. A transistor as recited in claim 1, wherein said second diffusion region includes top and side surfaces covered by a dielectric material, a borderless opening at least through a portion of the dielectric material on said top surface, and a second diffusion contact formed in the opening.

26. A transistor as recited in claim 1, wherein said gate structure includes top, bottom and side surfaces covered by a dielectric material, a borderless opening at least through a portion of the dielectric material on said top surface, and a gate contact formed in the opening.

27. A transistor as recited in claim 1, wherein said thirst diffusion region, said second diffusion region and said gate structure each include a borderless contact.

28. A vertical field effect transistor including a semiconductor pillar conduction channel, gate electrodes in trenches adjacent said semiconductor pillar, a layer of insulator adjacent said gate electrodes and opposite said semiconductor pillar, sidewalls adjacent said semiconductor pillar above said gate electrodes in said trenches, insulator material in said trenches above said gate electrodes and between said sidewalls and said layer of insulator, said insulator material being selectively etchable relative to said sidewalls and said semiconductor pillar, and at least one contact that is borderless to the gate electrodes.

29. A vertical transistor as recited in claim 28, further including isolation material adjacent said layer of insulator and surrounding said vertical transistor, said isolation material being selectively etchable relative to said layer of insulator.

30. A vertical transistor as recited in claim 29, wherein said at least one contact is formed in an opening in said isolation material adjacent said layer of insulator to a conductive region at an end of said pillar.

31. A vertical transistor as recited in claim 28, wherein said at least one contact includes a contact formed in an opening to an end of said pillar, and a contact formed in an opening adjacent to and extending above said pillar to said gate structure and insulated from said pillar by one of said sidewalls on said pillar.

32. A vertical transistor as recited in claim 28, further including a spacer in one of said trenches between one of said gate electrodes and a bottom of said one of said trenches.

33. An integrated circuit device including isolation material surrounding transistor locations in a substrate, vertical field effect transistors formed at said transistor locations and having a gate electrode structure formed in a trench, a layer of insulator material in said trench between said isolation material and said gate electrode structure, said isolation material being selectively etchable relative to said layer of insulator, a contact opening formed along an interface of said layer of insulator material and said isolation material, and at least one contact that is borderless to the gate electrode structure.

34. A device as recited in claim 33, wherein said gate electrode structure includes dual gate electrodes extending on opposite sides of a conduction channel.

35. A device as recited in claim 33, wherein said at least one contact is formed in said contact opening in said isolation material adjacent said layer of insulator material and extending to a conductive region.

36. A device as recited in claim 33, wherein said at least one contact includes a contact formed in an opening to an end of a semiconductor pillar in said trench, and a contact formed in an opening adjacent to and extending above said pillar to said gate electrode structure and insulated from said pillar by an insulating sidewall on said pillar.

37. A device as recited in claim 33, further including a spacer in said trench between said gate structure and a bottom of said trench.

* * * * *